(12) United States Patent  
Erbil et al.

(10) Patent No.: US 8,344,585 B2  
(45) Date of Patent: Jan. 1, 2013

(54) METHOD AND APPARATUS FOR CONVERSION OF HEAT TO ELECTRICAL ENERGY USING A NEW THERMODYNAMIC CYCLE

(75) Inventors: Ahmet Erbil, Atlanta, GA (US); David F. Walbert, Atlanta, GA (US)

(73) Assignee: The Neothermal Energy Company, Atlanta, GA (US)

( * ) Notice: Subject to any disclaimer, the term of this patent is extended or adjusted under 35 U.S.C. 154(b) by 0 days.

(21) Appl. No.: 13/226,799

(22) Filed: Sep. 7, 2011

(65) Prior Publication Data

US 2011/0316385 A1    Dec. 29, 2011

Related U.S. Application Data

(63) Continuation-in-part of application No. 12/465,924, filed on May 14, 2009, now Pat. No. 8,035,274.

(60) Provisional application No. 61/387,752, filed on Sep. 29, 2010.

(51) Int. Cl.
- *H02N 11/00* (2006.01)
- *H02N 1/00* (2006.01)
- *H01L 37/00* (2006.01)

(52) U.S. Cl. .................. 310/306; 136/254; 250/338.2; 322/2 A

(58) Field of Classification Search .......... 310/306–308; 322/2 A; 136/201, 254; 250/338.2
See application file for complete search history.

(56) References Cited

U.S. PATENT DOCUMENTS

| | | | |
|---|---|---|---|
| 3,073,974 A | 1/1963 | Hoh | |
| 3,243,687 A | 3/1966 | Hoh | |
| 3,554,515 A | 1/1971 | Tonooka et al. | |
| 3,824,448 A | 7/1974 | De Rivas | |
| 4,074,660 A | 2/1978 | Tsao | |
| 4,099,019 A | 7/1978 | Horibe et al. | |
| 4,210,820 A | 7/1980 | Wittig | |

(Continued)

FOREIGN PATENT DOCUMENTS

EP    1145333 A    10/2001

(Continued)

OTHER PUBLICATIONS

Olsen, R., Cascaded Pyroelectric Energy Converter, Ferroelectrics, 1984, vol. 59, pp. 205-219, Gordon and Breach, Science Publishers, Inc. US.

Vanderpool, D., Simulations of a Prototypical Device Using Pyroelectric Materials for Harvesting Waste Heat, Intl. J. of Heat & Mass Transfer, vol. 51, 2008, pp. 5052-5062, Los Angeles.

(Continued)

*Primary Examiner* — Burton Mullins  
(74) *Attorney, Agent, or Firm* — Morris Manning & Martin, LLP; Tim Tingkang Xia, Esq.

(57) ABSTRACT

A method for converting heat to electricity is described. The method can be used to efficiently and economically generate electricity from thermal energy directly through ferroelectric or other polarizable materials without the need for first converting thermal energy to mechanical energy or to any other form of energy or work. The method can involve subjecting a polarizable material to a thermodynamic cycle having two isothermal steps and two steps that occur at constant polarization. In an ideal implementation, this thermodynamic cycle allows the conversion of heat to electricity at the ultimate Carnot limit. The ferroelectric material can be continuously cycled in and out of its ferroelectric phase while heat is continuously converted to electricity at high voltage. The electrical energy so generated can be used in a virtually unlimited range of different applications or be stored for later use. An apparatus for converting heat to electricity is also described.

51 Claims, 23 Drawing Sheets

U.S. PATENT DOCUMENTS

| | | | |
|---|---|---|---|
| 4,220,906 | A | 9/1980 | Drummond |
| 4,226,606 | A | 10/1980 | Yaeger et al. |
| 4,245,693 | A | 1/1981 | Cheng |
| 4,296,800 | A | 10/1981 | Johnson |
| 4,327,670 | A | 5/1982 | Teller |
| 4,372,937 | A | 2/1983 | Johnson |
| 4,425,540 | A * | 1/1984 | Olsen .......................... 322/2 A |
| 4,589,890 | A | 5/1986 | Gronvaldt |
| 4,647,836 | A | 3/1987 | Olsen |
| 4,651,814 | A | 3/1987 | Ito et al. |
| 4,766,952 | A | 8/1988 | Onodera |
| 4,983,839 | A | 1/1991 | Deb |
| 5,555,838 | A | 9/1996 | Bergman |
| 5,625,245 | A | 4/1997 | Bass |
| 5,851,498 | A | 12/1998 | Rozenshtein et al. |
| 6,379,809 | B1 | 4/2002 | Simpson et al. |
| 6,431,856 | B1 | 8/2002 | Maenishi et al. |
| 6,528,898 | B1 | 3/2003 | Ikura et al. |
| 6,742,337 | B1 | 6/2004 | Hays et al. |
| 7,043,912 | B1 | 5/2006 | Radcliff et al. |
| 7,323,506 | B2 | 1/2008 | Kouchachvili et al. |
| 7,328,578 | B1 | 2/2008 | Saucedo |
| 7,569,194 | B2 | 8/2009 | Russell |
| 7,593,250 | B2 | 9/2009 | Naumov et al. |
| 7,735,321 | B2 | 6/2010 | Howard |
| 7,768,050 | B2 | 8/2010 | Rappe et al. |
| 7,807,917 | B2 * | 10/2010 | Atanackovic .............. 136/236.1 |
| 2003/0162394 | A1 | 8/2003 | Takemura |
| 2006/0122299 | A1 | 6/2006 | Kouchachvili et al. |
| 2008/0074211 | A1 | 3/2008 | Miles et al. |
| 2008/0130346 | A1 | 6/2008 | Naumov et al. |
| 2008/0295879 | A1 | 12/2008 | Atanackovic |
| 2009/0010303 | A1 | 1/2009 | Nagashima et al. |
| 2010/0037624 | A1 * | 2/2010 | Epstein et al. ................... 62/3.1 |
| 2010/0289377 | A1 | 11/2010 | Erbil et al. |
| 2011/0001390 | A1 | 1/2011 | Erbil et al. |
| 2011/0298333 | A1 * | 12/2011 | Pilon ............................. 310/306 |

FOREIGN PATENT DOCUMENTS

| | | | |
|---|---|---|---|
| GB | 1506587 | A | 4/1978 |
| JP | 55012508 | A | 1/1980 |
| JP | 63061125 | A | 3/1988 |
| JP | 63233340 | A | 9/1988 |
| KR | 1020070056373 | A | 6/2007 |
| WO | 9313564 | A1 | 7/1993 |
| WO | 9965051 | A2 | 12/1999 |
| WO | 00/36656 | A1 | 6/2000 |
| WO | 0036656 | A1 | 6/2000 |
| WO | 2005011376 | A2 | 2/2005 |
| WO | 2006058417 | A1 | 6/2006 |
| WO | 2007140061 | A2 | 12/2007 |
| WO | 2008088994 | A2 | 7/2008 |
| WO | 2010061385 | A1 | 6/2010 |

OTHER PUBLICATIONS

Lines, M. E. et al., "Principles and Applications of Ferroelectrics and Related Materials", App. F, 1977, Oxford University Press Inc., New York.

Olsen and Evans, "Pyroelectric Energy Conversion: Hysteresis loss and temperature sensitivity of a ferroelectric aterial", J. Appl. Phys. 54, Oct. 1983.

Kouchachvili and Ikura, "Pyroelectric Conversion—Effects of P(VDF-TrFE) preconditioning on Power Conversion", Journal of Electrostatics 65, 2007, pp. 182-188.

Tiffany, W., Coherent Inc.: The Amazing Versatile Pyroelectric, pp. 1-3.

U.S. DOE, A Technology Roadmap for Generation IV Nuclear Systems, 2002.

Study prepared for the U.S. Department of Energy by an MIT-lead interdisciplinary panel, The Future of Geothermal Energy: Impact of Enhanced Geothermal Systems (EGS) of the United States in the 21st Century, 2006.

V. Viswanathan, Opportunity Analysis for Recovering Energy From Industrial Waste Heat and Emissions, Pacific NW Nat'l Lab., 2005.

Prepared for the U.S. DOE, Energy Use, Loss and Opportunities Analysis: U.S. Manufacturing and Mining, 2004.

A. Burke, Energy Storage in Advanced Vehicle Systems, Institute of Transportation Studies, Univ. of California, Davis, (presented at Stanford University, 2005).

J. Yang, Thermolectric Technology for Automotive Waste Heat Recovery, General Motors R&D, presented at the 2007 DEER Conference, sponsored by U.S. DOE.

Duffie et al., Solar Engineering of Thermal Processes, John Wiley & Sons, Inc., 3rd Ed., 2006.

Babcock et al., Steam: Its Generation and Use, Chs. 47-56, 40th Ed. 1992.

Frank Incropera et al., Fundamentals of heat and Mass Transfer, John Wiley & Sons, Inc., 6th Ed., 2006.

Michael Moran et al., Introduction of Thermal Systems Engineering: Thermodynamics, Fluid Mechanics, and Heat Transfer, John Wiley & Sons, Inc., 2003.

Deborah Kaminiski et al., Introduction of Thermal and Fluids Engineering, John Wiley & Sons, Inc., 2005.

M. Wakil, Nuclear Energy Conversion, American Nuclear Society, 1992.

Robert Serth, Process Heat Transfer: Principles and Applications, Elsevier, 2007.

Hayes et al., Introduction to Catalytic Combustion, Gordon and Breach Science Publishers, 1997.

G.P. Peterson, An Introduction to Heat Pipes: Modeling, Testing and Applications, 1994.

International Search Report for PCT/US2011/051407.

* cited by examiner

900

910 — Providing a ferroelectric layer formed of a ferroelectric material characterized with a Curie temperature, $T_C$, with a pair of electrodes on the first and second surface of the ferroelectric layer, respectively.

920 — Alternatively delivering a flow of cold and hot fluids so as to alternately cool the ferroelectric layer to a first temperature $T_L$ that is lower than the Curie temperature $T_C$, and heat the ferroelectric layer to a second temperature $T_H$; the ferroelectric material of the ferroelectric layer thereby undergoes alternating phase transitions between the ferroelectric phase and the paraelectric phase with temperature cycling. The electrical circuit is open during heating and cooling under constant polarizations, $P_H$ and $P_L$, respectively.

930 — Alternatively delivering a flow of cold and hot fluids to as to alternatively remove heat from the ferroelectric layer isothermally at $T_L$ and add heat to the ferroelectric layer isothermally at $T_H$. During these steps, the electrical circuit is closed so that the addition and withdrawal of heat occurs while polarization alternates between maximum and minimum levels, $P_H$ and $P_L$, respectively.

940 — Poling the ferroelectric material as heat is removed isothermally at $T_L$ while polarization increases from $P_L$ to $P_H$, thereby generating electrically-opposite screening charges on the pair of electrodes.

950 — Outputting electric energy corresponding to the generated electrically-opposite screening charges on the pair of electrodes when heat is added isothermally to the ferroelectric material at $T_H$ and polarization is reduced from $P_H$ to $P_L$.

FIG. 7

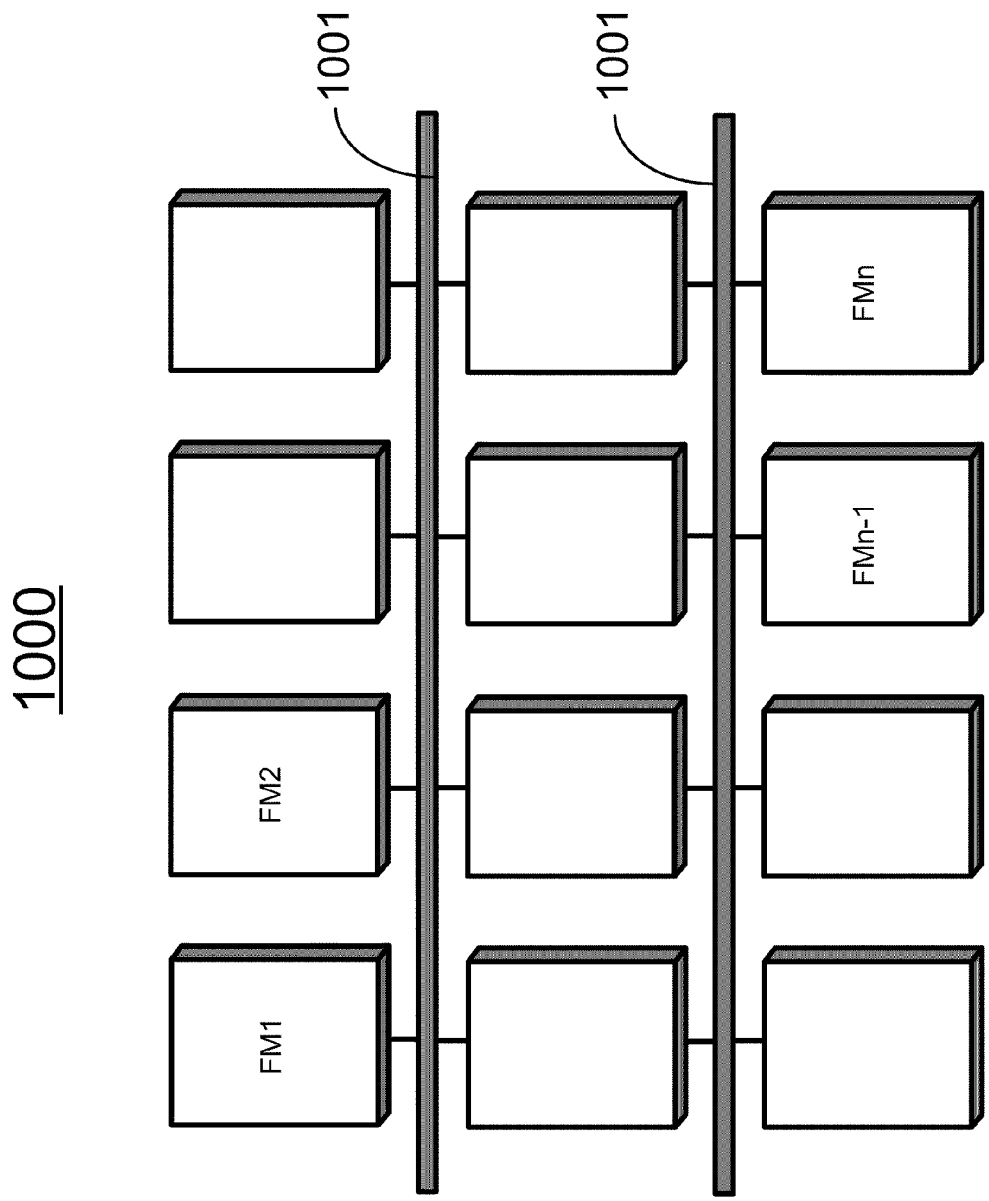

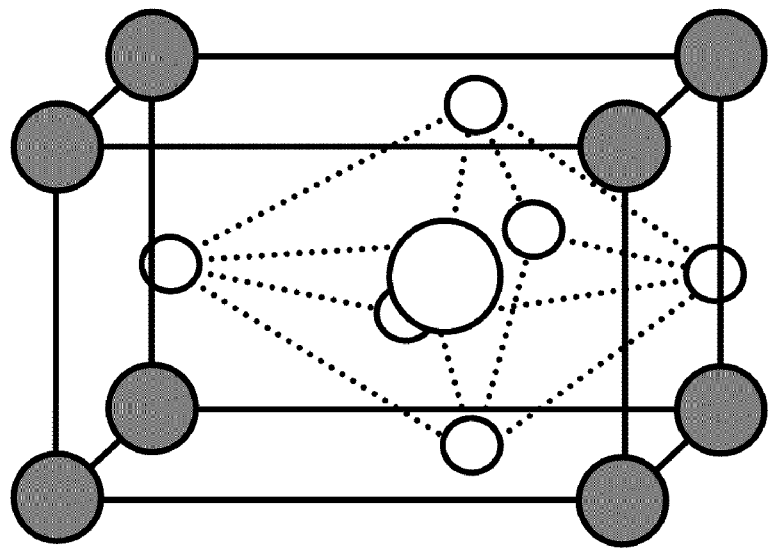
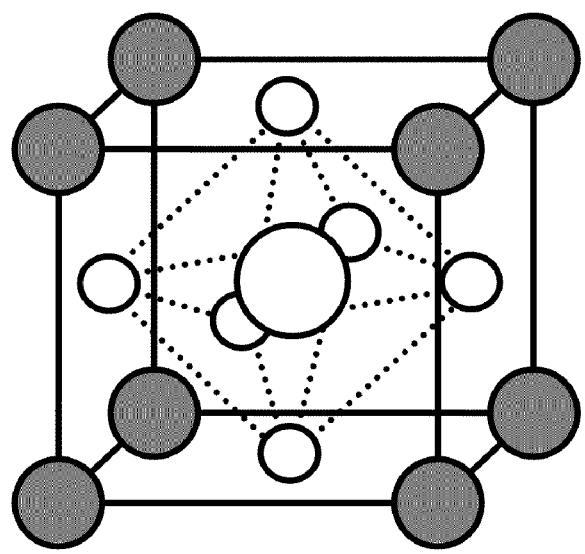
FIG. 14

METHOD AND APPARATUS FOR CONVERSION OF HEAT TO ELECTRICAL ENERGY USING A NEW THERMODYNAMIC CYCLE

CROSS-REFERENCE TO RELATED APPLICATIONS

This application is a continuation-in-part of U.S. patent application Ser. No. 12/465,924, filed May 14, 2009, now allowed. This application also claims the benefit of Provisional U.S. patent application Ser. No. 61/387,752, filed Sep. 29, 2010. Each of the above applications is incorporated by reference herein in its entirety.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention generally relates to conversion of heat to electrical energy, and more particularly to methods that utilize spontaneous polarization of ferroelectric materials that occurs when they are in a temperature range corresponding to their ferroelectric phase, and diminishes or disappears rapidly as the ferroelectric materials approach, or transition into, their paraelectric or antiferroelectric phase as the temperature changes, so as to convert heat to electric energy.

BACKGROUND OF THE INVENTION

The use of capacitors with temperature dependent dielectric constants to convert heat to electric energy is well known. Representative devices that use dielectrics as variable capacitors to generate electricity are disclosed, for example, in U.S. Pat. No. 4,220,906 to Drummond, U.S. Pat. Nos. 4,425,540 and 4,647,836 to Olsen, U.S. Pat. No. 6,528,898 to Ikura et al. and U.S. Pat. No. 7,323,506 to Kouchachvili et al. Those devices simply utilize the fact that the dielectric constant of certain materials, such as ferroelectrics, varies as temperature varies. Specifically, those devices use the dielectrics as temperature dependent variable capacitors, the capacitance of which decreases as the temperature is increased by the absorption of heat. The capacitor is partially charged under an applied field at the lower temperature, and is then fully charged by increasing the electric field. The capacitor is then heated while under that large field, and it partially discharges as the dielectric constant decreases with increasing temperature and correspondingly decreasing capacitance. Further discharge occurs by reducing the applied field while the capacitor remains at high temperature. (U.S. Pat. No. 4,425,540 to Olsen). Such cycling of the temperature and dielectric constant of a capacitor under an applied field is referred to as the Olsen cycle.

The physics of the capacitor device is straightforward. The voltage V of a capacitor of capacitance C is inversely proportional to the dielectric constant $\epsilon$:

$$V = Q/C = Q/[\epsilon(T)\epsilon_0(A/d)].$$

After the capacitor has been fully charged by application of the external field under the Olsen cycle, the capacitor is heated to a temperature at which the dielectric constant, $\epsilon$, decreases. During that heating step of the Olsen cycle, partial discharge occurs because the charge, Q, held by the capacitor decreases while V is held constant.

The use of dielectrics as variable capacitors to generate electricity is also reported by Olsen in Cascaded Pyroelectric Converter, 59 FERROELECTRICS 205 (1984). Olsen reports a maximum power density of 33 W/L (about 4 W/kg) using the ferroelectric PZST as the dielectric material in a variable capacitor device with multiple stages and regeneration. Using finite element simulation, Vanderpool calculates that the Olsen cycle yields a power density of 24 W/L (about 3 W/kg) under certain conditions using PZST as the dielectric material in a variable capacitor. Vanderpool, Simulations of a Prototypical Device Using Pyroelectric Materials for Harvesting Waste Heat, 51 INT. J. HT & MASS TRANSFER 5051 (2008).

The variable capacitor method of converting heat to electricity is not the most effective method of using ferroelectrics to generate electricity, however. True pyroelectric generation focuses, instead, on the inherent polarization that occurs spontaneously in the ferroelectric phase, independent of polarization induced by an applied field. That inherent polarization provides a much more robust source of electric energy. Variable capacitors do not use the powerful inherent spontaneous polarization that occurs in ferroelectrics without an applied field. Further, the application of large external fields and the continuous application of an external field during cycling impede the more powerful energy conversion that can be achieved with ferroelectrics through spontaneous polarization. Such external fields prevent the effective use of the tremendous electrical energy that arises from the electric dipoles of ferroelectric materials spontaneously and without induction by an external field.

Apparatus and methods for using the inherent spontaneous polarization of ferroelectrics to convert heat-to-electricity are disclosed in U.S. patent application Ser. No. 12/465,924 and U.S. Pat. No. 7,982,360 to Erbil. The inventions presented in those applications, unlike the prior art, utilize the spontaneous polarization of ferroelectrics, together with the rapid change in spontaneous polarization that occurs during phase transition, to convert heat-to-electrical energy. Unlike the variable capacitor approach, those inventions do not rely on the application of an electric field to induce electric dipoles in the ferroelectric material. They do contemplate the use of a small electric field during or after transition to the ferroelectric phase in order to pole the ferroelectric, but that field is not used to create the fundamental polarization in the unit cells themselves. The poling field simply aligns the inherent electric dipoles that occur spontaneously when the material is at a temperature that causes it to be in its ferroelectric phase.

The apparatus and methods set forth in application Ser. No. 12/465,924 and U.S. Pat. No. 7,982,360 are a new way of converting thermal energy to electricity. With that new methodology, there exists a need to address optimal ways to use spontaneous polarization for the purpose of generating electricity from thermal energy.

SUMMARY OF THE INVENTION

The present invention provides an apparatus and enhanced method for converting heat to electric energy by the use of ferroelectrics in which the phase transitions into and out of the ferroelectric phase occur at desired temperatures. The invention can also be used with other electrically polarizable materials. This invention discloses a new thermodynamic cycle that allows for greater output of electrical energy than may be possible with other cycles.

When in the ferroelectric phase, very strongly polarized electric dipoles develop spontaneously in the unit cells of one or more ferroelectrics, which occurs without the application of an external field. By poling to align the unit cells and domains, the polarization of the individual unit cells and domains combines to produce an extremely large net spontaneous polarization in the overall material system. That net polarization is designated as $P_s$, which may also be referred to as the remanent polarization, $P_r$, in the absence of an external field. The present invention utilizes the spontaneous polarization, together with the rapid change in that polarization that occurs during thermal cycling and phase transition, to convert heat to electrical energy. The present invention does not require temperature variability of the dielectric constant. The electrical energy that is generated as a result of spontaneous polarization, and released with the diminution or disappearance of polarization, can be much greater than the electrical energy generated using a ferroelectric through the application of an external electric field in the variable capacitor mode.

By utilization of one or more heat exchangers, the temperature of the ferroelectric material is controlled so that it undergoes transition into the ferroelectric phase. During or after transition to the ferroelectric phase, a small electric field is used for the purpose of poling the ferroelectric. That poling field aligns the spontaneous electric dipoles to the extent allowed by the molecular and crystal structure of the particular material. Other than for such initial poling, an external electric field is not necessary as a part of the process or the cycling of the device. Although application of large electric fields are essential for operation of variable capacitor devices and the Olsen cycle, the application of such external fields, and fields beyond the minimum required for poling, generally will diminish the effectiveness of the present invention in generating electrical energy.

When the ferroelectric material of the present invention is in its ferroelectric phase and poled, a very strong inherent electric field results spontaneously from the dipoles, without induction by application of an external field. The spontaneous polarization gives rise to very dense bound charges on the surfaces of the ferroelectric, which in turn induce opposing, screened charges on electrodes that are on the surfaces of the ferroelectric material. At that point, the net electric field in the electrodes is negligible. By utilization of one or more heat exchangers, the temperature of the ferroelectric is then changed so that it passes through phase transition, becoming either paraelectric or antiferroelectric, depending upon the particular material used and the phase transition temperature around which the material is cycled. By causing the ferroelectric to go through phase change and rendering the bound surface charges negligible, the screened charges on the electrodes become unscreened and can be removed to external circuitry for general purposes.

As disclosed in U.S. patent application Ser. No. 12/465,924 and U.S. Pat. No. 7,982,360 to Erbil, by utilization of one or more heat exchangers the temperature of the ferroelectric material can be cycled around the phase transition temperature, or Curie temperature, $T_c$, so that thermal energy can be effectively converted to electrical energy with the invention operating between the heat source and heat sink. Electric energy is generated by cycling the ferroelectric module above and below the phase transition temperature in accordance with the apparatus and method described in that application. Various thermodynamic cycles can be used to exploit spontaneous polarization in ferroelectrics for the purpose of converting heat to electricity. A new thermodynamic cycle for that purpose is disclosed by the present invention.

The present invention provides an apparatus and a method for thermodynamically cycling ferroelectrics and other electrically polarizable materials to robustly convert heat to electricity. The cycle has four steps. For materials in which the ferroelectric phase occurs at a temperature below the phase transition temperature, the ferroelectric is cooled in a first step of the cycle to a relatively low temperature, $T_L$, below the transition temperature, while the electrical circuit is maintained open so that total polarization is held constant at a relatively low value, $P_L$, which may be zero. During the next step, heat is withdrawn isothermally until polarization is increased to the maximum value for the cycle, $P_H$, at which point a very dense bound charge is present on the surface of the electrode. During that step, the electrical circuit is closed so that a current flows from the electrode on one side of the ferroelectric to the electrode on the opposite side. Screening charges that develop on the electrodes equal the opposing bound charges at the surfaces of the ferroelectric. Also during that step of the cycle, a small poling field is applied so that the resulting dipoles are biased in one orientation—i.e., they become poled.

In the next step of the cycle, the circuit is opened and the ferroelectric, or other polarizable material, is heated to a relatively high temperature, $T_H$, above the transition temperature. Total polarization remains constant during that step, and the material goes into a metastable state. During the final step of the cycle, the circuit is again closed and heat is input isothermally until polarization is reduced to $P_L$. During that step, the screened charges on the electrode become unscreened and are discharged into external circuitry at a self-generated high voltage. By controlling the cycling of the ferroelectric in this fashion, the amount of electrical energy discharged during each full cycle is enhanced in comparison to other cycling formats. The cycle is performed under a control circuit operating under computer control to cause the addition and withdrawal of heat in accordance with the steps of the cycle. The control circuit, acting under computer control, also causes the electrical circuit to open and close and the poling field to be applied in accordance with the cycle.

The cycle is then repeated continuously, with the result that thermal energy is continuously converted to electrical energy at high voltage. The invention can be used with ferroelectrics that are in either solid or liquid form, the latter including liquid ferroelectrics and ferroelectric fine crystals suspended in liquid. For example, the solid materials that can be used include ceramic ferroelectrics, ferroelectric polymers, and other polarizable polymers. In addition to the ordinary ferroelectrics, extrinsic (or improper) ferroelectrics, such as boracites and sodalites, can be used with this invention. With extrinsic ferroelectrics, polarization represents a second order parameter, which is coupled to some primary order parameter. Exploiting the spontaneous polarization of ferroelectrics with the present invention allows a robust conversion of heat to electrical energy over a wide range of temperatures using heat supplied from many sources, both naturally occurring and generated. Heat can be input to the ferroelectric from the heat source or withdrawn from the ferroelectric to the heat sink by conduction, convection or radiation or by any combination thereof, and by one or two-phase heat transfer systems.

A single stage power conversion module includes a single ferroelectric or other polarizable material. As such, it generally has a single phase transition temperature reflecting the transition between the ferroelectric phase and the paraelectric or the antiferroelectric phase. In order to more effectively convert available thermal energy to electricity in applications where the temperature difference, ΔT, between the heat source and heat sink is sufficient, a series of ferroelectric or other polarizable materials may be used that have a succession of phase transition temperatures that incrementally cover all, or at least some, of the range of temperatures between the heat source and heat sink. The magnitude of ΔT that warrants a multi-stage device depends on the parameters and requirements of the application and the characteristics of the particular material used. The use of heat regeneration techniques may also affect the number of stages desired in a particular application.

In one aspect, the present invention relates to an apparatus for converting heat to electric energy. In one embodiment, the apparatus has a ferroelectric layer having a first surface and an opposite, second surface, where the ferroelectric layer is comprised of a ferroelectric material with a phase transition temperature such that, when the material is in a ferroelectric phase spontaneous polarization is established in the unit cells of the ferroelectric, and the ferroelectric layer, when poled, develops an overall net spontaneous polarization; and such that, as the temperature of the ferroelectric changes so that it traverses the transition temperature, the material enters a paraelectric or antiferroelectric phase wherein the ferroelectric layer has negligible or no overall net spontaneous polarization.

The apparatus also has a pair of electrodes respectively positioned on the first surface and the second surface of the ferroelectric layer, wherein the electrodes consist of a thermally and electrically conductive material, and means positioned in relation to the pair of electrodes for alternately inputting and removing heat through convection, conduction, or radiation to and from the ferroelectric layer so as to, respectively, heat the ferroelectric layer at a temperature $T_H$ that is higher than the phase transition temperature, and alternately cool the ferroelectric layer at a temperature $T_L$ that is lower than the phase transition temperature, so that the ferroelectric material of the ferroelectric layer thereby undergoes alternating phase transitions between (1) the ferroelectric phase and (2) the paraelectric or antiferroelectric phase.

In another aspect, the present invention relates to an apparatus for converting heat to electric energy. In one embodiment, the apparatus includes a ferroelectric layer having a first surface and an opposite, second surface. The ferroelectric layer consists of a ferroelectric material characterized with a Curie temperature, $T_c$, such that when the temperature of the ferroelectric material is lower than the Curie temperature $T_c$, the ferroelectric material is in a ferroelectric phase in which spontaneous polarization is established in the unit cells of the ferroelectric material, and when the temperature of the ferroelectric material is greater than the Curie temperature $T_c$, spontaneous polarization is not established in the unit cells of the ferroelectric material. The apparatus also includes a pair of electrodes positioned respectively on the first surface and the second surface of the ferroelectric layer. The pair of electrodes is comprised of a thermally and electrically conductive material.

Furthermore, the apparatus includes means positioned in relation to the pair of electrodes for alternately delivering a cold fluid and a hot fluid over the first surface and the second surface of the ferroelectric layer so as to alternately (1) cool the ferroelectric layer at a first temperature $T_L$ that is lower than the Curie temperature $T_c$, and (2) heat the ferroelectric layer at a second temperature $T_H$ that is higher than the Curie temperature $T_c$, so that the ferroelectric material of the ferroelectric layer thereby undergoes alternating phase transitions between the ferroelectric phase and the paraelectric phase with temperature cycling.

Additionally, the apparatus may have a pair of electric leads electrically connected to the pair of electrodes such that when the ferroelectric material of the ferroelectric layer is in or transitioning into the ferroelectric phase, a DC voltage is applied between the pair of electric leads to pole the unit cells and domains of the ferroelectric material; and when the ferroelectric material is cycled to diminish the total polarization of the ferroelectric layer, the electric energy corresponding to the electrically-opposite screening charges is output to the pair of electric leads at a voltage that is much higher than the DC voltage applied for poling.

Moreover, the apparatus may include means for monitoring one or more of the temperature and capacitance of the ferroelectric layer and the temperature and pressure of the heating and cooling fluids.

In another embodiment, the delivering means comprises a first fluid passage and a second fluid passage formed on the pair of electrodes, respectively, such that when a cold fluid passes through at least one of the first and second fluid passages, the ferroelectric layer is cooled, and when a hot fluid passes through at least one of the first and second fluid passages, the ferroelectric layer is heated; one or more heat exchangers positioned such that the first and second fluid passages alternately deliver a cold fluid and a hot fluid over the first surface and the second surface of the ferroelectric layer so as to alternately cool the ferroelectric layer at a first temperature $T_L$, and heat the ferroelectric layer at a second temperature $T_H$; and a plurality of control valves in communication with the one or more heat exchangers for controlling the flow of cold and hot fluids. The plurality of control valves is controlled by microcontrollers, and they are coordinated by computer control through a control circuit to achieve the cycle described herein.

In yet another aspect, the present invention relates to a method for converting heat to electric energy. In one embodiment, the method includes the steps of providing a ferroelectric layer having a first surface and an opposite, second surface, wherein the ferroelectric layer is comprised of a ferroelectric material with a phase transition temperature such that, when the material is in a ferroelectric phase spontaneous polarization is established in the unit cells of the ferroelectric, and the ferroelectric layer, upon poling, develops an overall net spontaneous polarization, and such that, as the temperature of the ferroelectric changes so that it traverses the transition temperature, the material enters a paraelectric or antiferroelectric phase wherein the ferroelectric layer has negligible or no overall net spontaneous polarization; and including a pair of electrodes positioned respectively on the first surface and the second surface of the ferroelectric layer, the electrodes being comprised of a thermally and electrically conductive material.

The method also includes the steps of alternately delivering a cold fluid and a hot fluid so as to alternately cool the ferroelectric layer to a temperature that is lower than the Curie temperature, $T_c$, and heat the ferroelectric layer to a second temperature that is higher than the Curie temperature $T_c$. During these steps, the electrical circuit is opened and cooling and heating occur under constant polarization.

The method also includes the steps of alternately providing and removing heat to and from the ferroelectric layer, isothermally, by alternately delivering a flow of hot fluid and a flow of cold fluid as to alternately add or remove heat to the ferroelectric layer while total polarization changes to corresponding low and high levels denoted as $P_L$ and $P_H$ respectively. During these steps, the electrical circuit is closed to allow changing polarization, and the heat removed or added corresponds to the enthalpy of transition.

The method also includes the step of poling the ferroelectric material of the ferroelectric layer when it is in the ferroelectric phase at $T_L$. In one embodiment, the poling is performed by applying a small external field to the ferroelectric layer so as to align the dipoles of the ferroelectric layer. The method also includes the step of discharging the electrical energy generated in the ferroelectric material of the ferroelectric layer into external circuitry by closing the circuit while heat is input to the ferroelectric layer, isothermally, and polarization diminishes to negligible or zero, corresponding to $P_L$.

In one embodiment, the thermal delivering step is performed by one or more heat exchangers that are in fluid communication with a heat source and a heat sink for inputting heat from the heat source to the ferroelectric layer so as to heat it, and withdrawing heat from the ferroelectric layer to the heat sink so as to cool it. In another embodiment, the thermal delivering step is performed by one or more heat exchangers and a plurality of control valves in communication with the one or more heat exchangers, wherein are positioned first and second fluid passages for alternately delivering a cold fluid and a hot fluid over the first surface and the second surface of the ferroelectric layer so as to alternately cool and heat the ferroelectric layer, and wherein the plurality of control valves is adapted for controlling the flow of cold and hot fluids. In each instance, the electrical circuit is switched between open and closed positions in coordination with the heating and cooling cycling in order to achieve the four-step cycle described herein, with two isothermal steps and two steps with constant total polarizations.

In addition to materials with a crystal structure, amorphous polymer materials that are electrically polarizable can be used with the invention. For such amorphous polymers, the polarizable units exhibit electric dipolar behavior at the atomic and molecular level. An overall net polarization occurs with such polarizable amorphous polymer (and copolymer) systems, when poled, and that net polarization diminishes and disappears when the temperature of the material traverses the depolarization transition temperature. The changes in polarization that occur with cycling of such amorphous polymer systems around their depolarization transition temperatures are exploited by the invention in the same general fashion as the invention uses the spontaneous polarization, and changes in polarization, that occur in crystalline ferroelectric materials. For amorphous materials, the depolarization transition temperature is analogous to $T_c$ or to the ferroelectric phase transition. Where reference is made to the use of ferroelectric materials and ferroelectric layers in the invention, it should be understood that polarizable amorphous polymers (and copolymers) with appropriate polarization and transition characteristics can also be used with the invention.

In a further aspect, the present invention relates to an apparatus for converting heat to electric energy. In one embodiment, the apparatus has a plurality of ferroelectric modules, $\{FM^n\}$, arranged in a stack, where n=1, 2, 3, ... N, N being an integer greater than one. Each ferroelectric module $FM^n$ includes a ferroelectric layer having a first surface and an opposite, second surface, wherein the ferroelectric layer is formed of a ferroelectric material characterized with a transition temperature, $T^n$, such that when the ferroelectric material is in a ferroelectric phase, spontaneous polarization is established in the unit cells of the ferroelectric, and the ferroelectric layer, upon poling, develops an overall net spontaneous polarization, and such that, as the temperature of the ferroelectric changes so that it traverses the transition temperature, the material enters a paraelectric or antiferroelectric phase wherein the ferroelectric layer has negligible or no overall net spontaneous polarization. In one embodiment, a pair of electrodes consisting of a thermally and electrically conductive material is positioned on the first surface and the second surface of the ferroelectric stack. In another embodiment, such electrodes are also positioned on the first surface and the second surface of each ferroelectric module, $FM^n$; and in yet another embodiment, such electrodes between adjacent ferroelectric modules are separated by an electrical insulator. The transition temperatures $\{T^n\}$ of the plurality of ferroelectric modules $\{FM^n\}$ may vary successively across the range between temperatures of a heat source and a heat sink.

The apparatus further includes means positioned in relation to the stacked ferroelectric modules $\{FM^n\}$ for alternately inputting and removing heat through convection, conduction, or radiation to and from the stacked ferroelectric modules $\{FM^n\}$ so as to alternately cool the stacked ferroelectric modules $\{FM^n\}$ at a first temperature that is lower than each transition temperature $T^n$, and heat the stacked ferroelectric modules $\{FM^n\}$ at a second temperature that is higher than each transition temperature $T^n$, such that each ferroelectric layer of the stacked ferroelectric modules $\{FM^n\}$ thereby undergoes alternating phase transitions between (1) the ferroelectric phase and (2) the paraelectric or antiferroelectric phase.

The apparatus may further include devices to monitor, among other things, the temperature and capacitance of one or more ferroelectric modules $FM^n$ and the temperature and pressure of the heating and cooling fluids. Thermal cycling is coordinated with the electrical status of the ferroelectric modules $\{FM^n\}$ under computer control so as to synchronize heating and cooling with electrical input and output, pursuant to the general cycle of the invention that utilizes two isothermal steps and two steps at constant polarizations, together with poling and electrical discharge.

In yet a further aspect, the present invention relates to an apparatus for converting heat to electric energy. In one embodiment, the apparatus has a plurality of ferroelectric modules, $\{FM^n\}$, arranged in a stack, where n=1, 2, 3, ... N, N being an integer greater than one. Each ferroelectric module $FM^n$ includes a ferroelectric layer having a first surface and an opposite, second surface, wherein the ferroelectric layer is formed of a ferroelectric material characterized with a Curie temperature, $T_c^n$, such that when the temperature of the ferroelectric material is lower than the Curie temperature, $T_c^n$, the ferroelectric material is in a ferroelectric phase in which spontaneous polarization is established in the unit cells of the ferroelectric material, and when the temperature of the ferroelectric material is greater than the Curie temperature, $T_c^n$, spontaneous polarization is not established in the unit cells of the ferroelectric material; and in one embodiment a first electrode and a second electrode are positioned on the first surface and the second surface of the ferroelectric stack, respectively; and in another embodiment a first electrode and a second electrode are positioned on the first surface and the second surface of each ferroelectric module, $FM^n$. Different ferroelectric layers of the plurality of ferroelectric modules $\{FM^n\}$ are comprised of an identical ferroelectric material or different ferroelectric materials. In one embodiment where a first electrode and a second electrode are positioned on the first surface and the second surface of each ferroelectric module, $FM^n$, each two adjacent ferroelectric modules are separated by an electrical insulator. The Curie temperatures $\{T_c^n\}$ of the plurality of ferroelectric modules {FM″} may vary successively across the range between temperatures of a heat source and a heat sink.

The apparatus further includes means positioned in relation to the stacked ferroelectric modules {FM″} for alternately delivering a cold fluid and a hot fluid over the stacked ferroelectric modules {FM″} so as to alternately cool the stacked ferroelectric modules {FM″} at a first temperature that is lower than each Curie temperature $T_c″$, and heat the stacked ferroelectric modules {FM″} at a second temperature that is higher than each Curie temperature $T_c″$, thereby each ferroelectric layer of the stacked ferroelectric modules {FM″} undergoes alternating phase transitions between the ferroelectric phase and the paraelectric phase with temperature cycling.

The apparatus may further include devices to monitor the temperature and capacitance of one or more ferroelectric modules FM″ and the temperature and pressure of the heating and cooling fluids. Thermal cycling is coordinated with the electrical status of the ferroelectric modules {FM″} through a control circuit to synchronize heating and cooling with electrical input and output, pursuant to the general cycle of the invention that utilizes two isothermal steps and two steps at constant polarizations.

The invention can be used for an extremely broad range of applications, including both for improvements to exiting devices and for new devices. By way of illustrative example and not with any intention to limit the application of the invention, others being apparent to those skilled in the art, such applications include: (1) bottoming up thermal power plants by converting waste heat to additional power output; (2) use of the present invention as the principal or sole means of converting thermal energy to electricity at power plants; (3) generation of electric power from geothermal energy sources, including passive geothermal heating and cooling systems; (4) generation of electric power from heat provided by solar energy, such generation being on any scale from, for example, a few watts or less to over 1,000 MW; (5) generation of distributed power with portable or quasi-portable generators using a variety of heat sources and operating on a scale from, for example, a few watts or less to 100 kW or more; (6) conversion to power of waste heat from industrial, mining, and other such sources; (7) power electric motor vehicles by generating electricity from thermal energy produced on board the vehicle, or otherwise, by combusting gas or other means; (8) producing electric power for diesel electric locomotives either from their waste heat or as the principal means of generating electricity; (9) generation of power from ocean thermal gradients; (10) cooling and refrigeration in a multitude of specific applications, whereby electric energy is used to extract heat from the desired source, in reverse operation of the cycling used to generate electricity from heat; (11) generation of electricity for personal or medical use from body heat; (12) small power sources for personal electronic devices, PCs, GPS systems, and the like; (13) generation of power from heat from biomass or municipal waste; and (14) power generation in space from, for example, heat generated by radioisotopes.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more aspects or embodiments of the invention and, together with a written description, serve to explain the principles of the invention. Where practical, the same reference numbers are used throughout the drawings to refer to the same or like elements of an embodiment.

FIG. 7 is a flow chart of a process for converting heat to electric energy according to one embodiment of the present invention.

FIG. 8 shows schematically a ferroelectric device for converting heat to electric energy according to one embodiment of the present invention.

FIG. 14 illustrates schematically the shift from (a) the paraelectric cubic state of a Perovskite crystal to (b) the tetragonal configuration, the latter reflecting the ferroelectric state with displaced ions that arise from deformation of the unit cell, thereby making the unit cell an electric dipole, which in the aggregate with the other dipoles throughout the material give rise to spontaneous polarization, $P_S$.

DETAILED DESCRIPTION OF THE INVENTION

Figure 1:
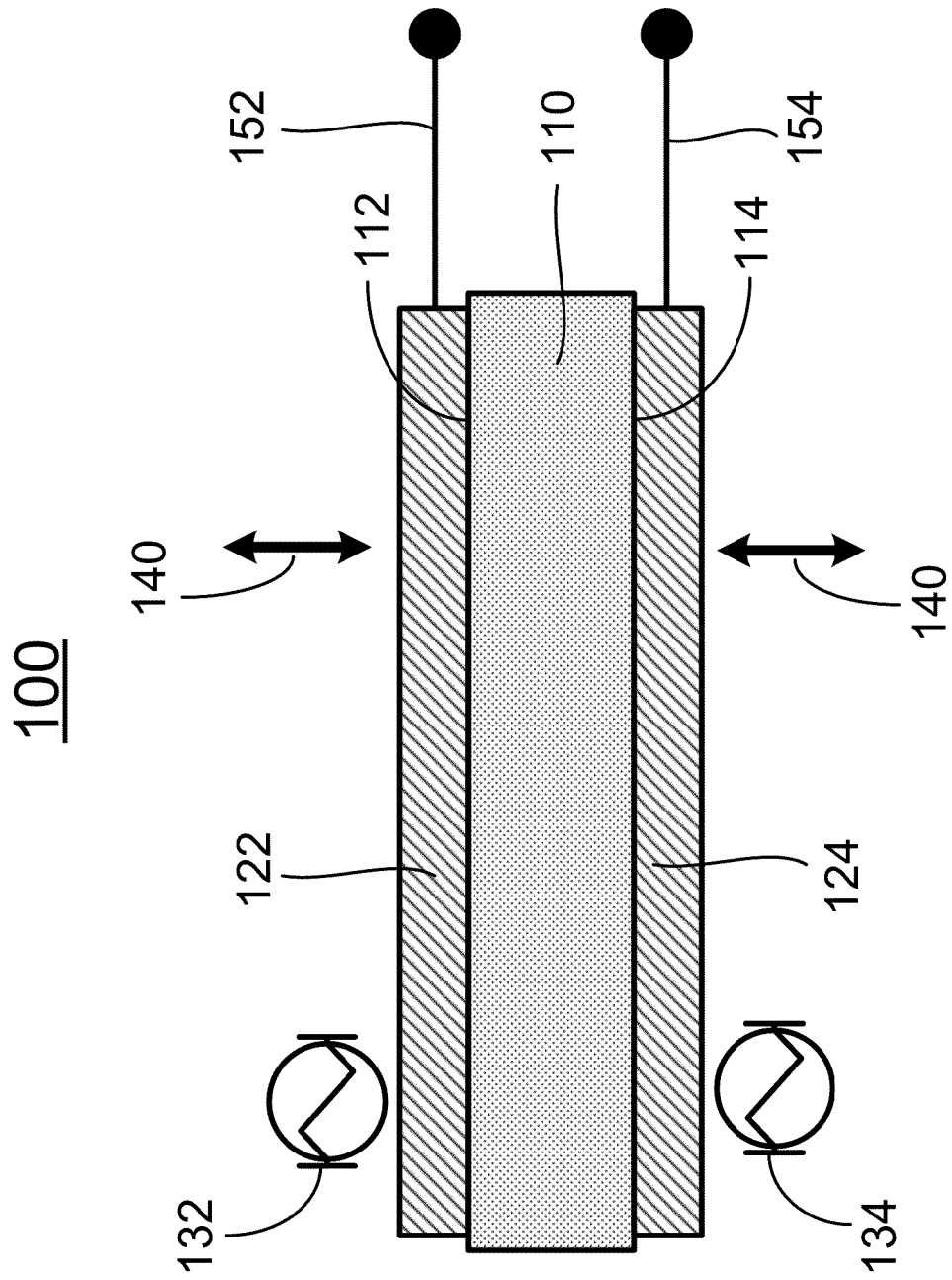
FIG. 1 is schematically a cross-sectional view of a ferroelectric device for converting heat to electric energy that utilizes changes in spontaneous polarization that occurs in temperature cycling to generate electric charges that can be removed to external circuitry at high voltage, according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Additionally, some terms used in this specification are more specifically defined below.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Figure 15:
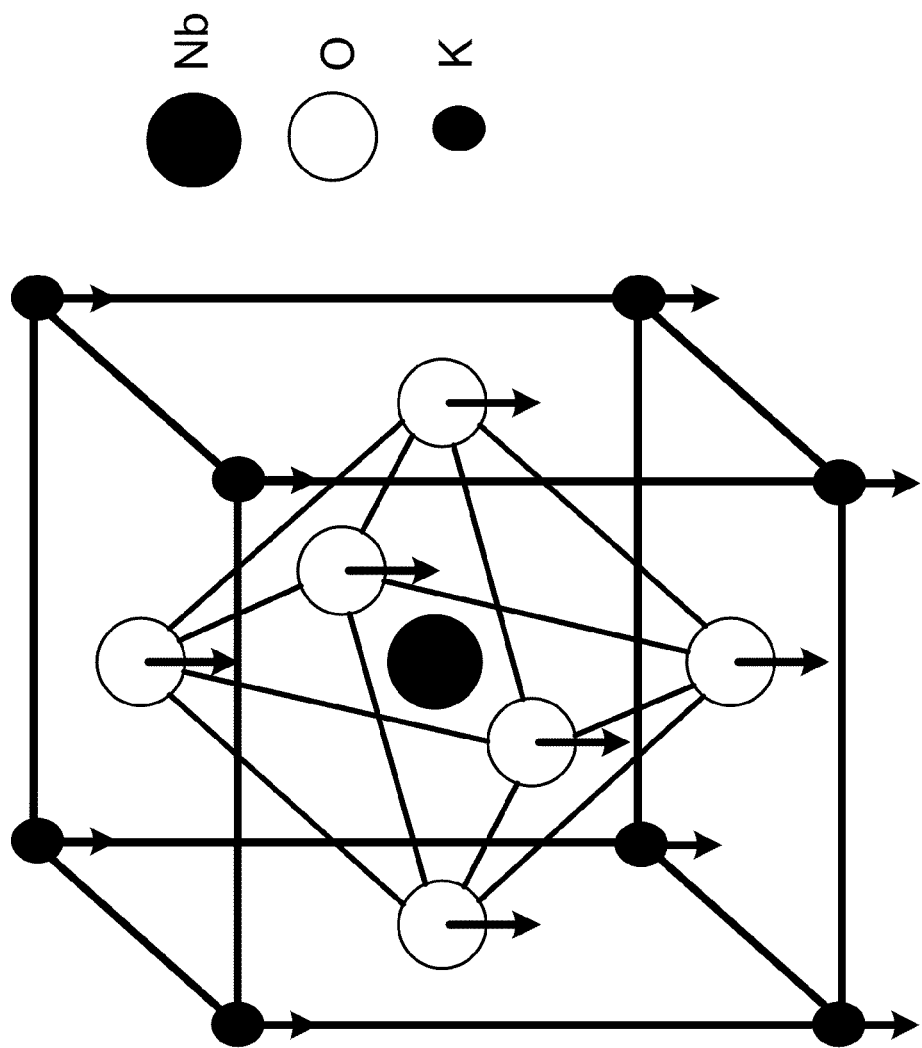
FIG. 15 illustrates schematically the displacement of potassium and oxygen ions on the corners and faces, respectively, of $KNbO_3$ in the ferroelectric state, where the ionic displacement creates spontaneous polarization.

As used herein, the term "unit cell" refers to a crystal structure that is a unique arrangement of atoms in a crystal. A crystal structure is composed of a motif, a set of atoms arranged in a particular way, and a lattice. Motifs are located upon the points of a lattice, which is an array of points repeating periodically in three dimensions. The points can be thought of as forming identical tiny boxes, called unit cells, that fill the space of the lattice. The lengths of the edges of a unit cell and the angles between them are called the lattice parameters. The crystal structure of a material or the arrangement of atoms in a crystal structure can be described in terms of its unit cell. The unit cell is a tiny box containing one or more motifs, a spatial arrangement of atoms. The unit cells stacked in three-dimensional space describe the bulk arrangement of atoms of the crystal. The crystal structure has a three dimensional shape. The unit cell is given by its lattice parameters, the length of the cell edges and the angles between them, while the positions of the atoms inside the unit cell are described by the set of atomic positions measured from a lattice point. Examples of unit cells are illustrated in FIGS. 14 and 15.

As used herein, the term "Curie temperature" or $T_c$ refers to a characteristic property of a ferroelectric material. At temperatures below the Curie temperature, the ferroelectric material generally is in a ferroelectric phase in which spontaneous polarization is established in the unit cells of the ferroelectric material. As the temperature is increased towards the Curie temperature, the spontaneous polarization established in the unit cells decreases. Above the Curie temperature, the ferroelectric material is generally in a paraelectric phase in which spontaneous polarization is not established in the unit cells of the ferroelectric material. There are ferroelectrics, however, where a ferroelectric phase exists at temperatures above the transition temperature, and the material is paraelectric below that transition temperature. Also, there are transition temperatures between ferroelectric and antiferroelectric phases that are relevant to the invention, as described herein, and the ferroelectric phase may occur at a higher temperature than the antiferroelectric phase. There does not appear to be a clearly established usage as to whether "Curie temperature" also applies to the transition temperatures for these latter kinds of phase transitions. The terms "phase transition temperature" and "transition temperature" are used herein to include all of the foregoing types of phase transitions. "Curie temperature" or $T_c$ may be used only in conjunction with the first type of phase transition, or it may be used more broadly when apparent from the context.

In practice, for all of the above described types of phase transitions, the sharpness of the phase change as the material temperature crosses the transition temperature is determined by the homogeneity of the composition and the crystal structure, such that the transition between phases may take place progressively as the temperature of the ferroelectric material increases or decreases over a temperature range around the designated transition temperature of the material.

Whenever the use of ferroelectric materials are disclosed herein, it is intended that such use include both ordinary and improper ferroelectrics, with the ferroelectric material being cycled with respect to its phase transition as described.

In addition to ferroelectric materials with a crystal structure, amorphous materials that are polarizable can be used with the invention. Some such materials provide a very robust basis for converting thermal energy to electricity. For such amorphous materials, the depolarization transition temperature is analogous to $T_c$ or the ferroelectric phase transition temperature as described above. Whenever the use of ferroelectric materials are disclosed herein, it is intended that that use include the cycling of such polarizable amorphous materials. In that instance, the polarizable amorphous material is cycled like the ferroelectric material, with the depolarization transition temperature being used in the cycle in lieu of the ferroelectric phase transition temperature.

Various polarizable amorphous materials are of particular utility with the invention because their depolarization transition temperatures are in a useful range for many applications, generally less than ~250° C., although they may also be at greater temperatures, and they produce a robust discharge of electrical energy when cycled. The relationship between energy, polarization, and permittivity is:

$$U = P^2/2\epsilon \epsilon_0.$$

While P is generally smaller with such amorphous polymers than is the case, for example, with ferroelectric ceramics, the permittivity for such materials is much smaller, yielding a high energy density, U.

Examples of polarizable amorphous materials that can be used with the invention include MXD6 Nylon, which has a transition temperature of approximately 78 C and has produced measured discharge voltages of approximately 800 V for a sample 70 μm thick. A PANMA-4 acrylonitrile copolymer sample 50 μm thick has produced a discharge voltage of approximately 1,300 V with a transition temperature of approximately 100 C.

On occasion, "polarization" is used herein where it might be more precise to refer to "electric displacement." Since there is no significant difference between the terms in this context, polarization is used throughout for simplicity and clarity.

Without intent to limit the scope of the invention, exemplary apparatuses and methods and their related results according to the embodiments of the present invention are given below. Note that titles or subtitles may be used in the examples for convenience of a reader, which in no way should limit the scope of the invention. Moreover, certain theories are proposed and disclosed herein; however, in no way, whether they are right or wrong, should they limit the scope of the invention so long as the invention is practiced according to the invention without regard for any particular theory or scheme of action.

In accordance with the purposes of this invention, as embodied and broadly described herein, this invention, in one aspect, relates to an apparatus and method for converting thermal energy directly to electrical energy through a ferroelectric medium without the energy passing through intermediate mechanical mechanisms or through other forms. The invention exploits the large inherent spontaneous polarization that develops in ferroelectric materials when they are in their ferroelectric phase. The spontaneous polarization that arises in the unit cells of ferroelectric materials or other polarizable materials, which is exploited by the invention, occurs without application of an external E field. The unit cell polarization occurs spontaneously as a result of the material transitioning into a ferroelectric phase. The powerful spontaneous polarization of the unit cells produces a large overall net polarization in the ferroelectric material as a whole when the unit cells and domains are aligned by poling. The invention further exploits the large changes in overall net spontaneous polarization that occur when a change in the temperature of the ferroelectric material causes a transition to a phase that has negligible net polarization.

The invention permits the removal and use of the electrical energy generated by the spontaneous polarization that occurs when the material is in the ferroelectric phase. The electrical energy so generated can be exported to external circuitry in conjunction with phase transition of the material from the ferroelectric phase to a non-polar phase. The inherent net spontaneous polarization, $P_s$, disappears as the material transitions to a non-ferroelectric phase. Commonly, the phase transition that renders $P_s$ negligible will be from the ferroelectric phase to the paraelectric phase, but it may also be from the ferroelectric phase to the antiferroelectric phase, since the antiferroelectric phase produces negligible net spontaneous polarization in the material overall.

To allow the conversion of thermal energy to electrical energy with the invention, the basic ferroelectric module is cycled around its phase transition temperature. That temperature cycling is accomplished by one or more heat exchangers that interface between the ferroelectric module and a heat source and heat sink. The heat exchangers and heat source are not limited and may include any mode by which thermal energy is transferred, including convective, conductive and radiative transfer, and one and two-phase thermal transfer systems. The invention can be used generally to convert thermal energy where: (1) at least a portion of the temperature range between the heat source temperature, $T_H$, and heat sink temperature, $T_L$, are within the range of phase transition temperatures for one of the many ferroelectric materials that exist; and (2) the temperature difference, $\Delta T = (T_H - T_L)$, is sufficient to allow effective conversion for the particular application.

There are ferroelectrics with phase transition temperatures that range from as low as about 0° C. to as high as about 700° C., and the invention can be operated in that range with such ferroelectrics. There is no theoretical limit to the operating temperature of the apparatus or method, and it can also be used at temperatures below 0° C. and above 700° C. insofar as appropriate ferroelectrics are available.

The magnitude of the temperature difference, $\Delta T$, that may be sufficient to use the device depends largely on practical issues, such as the efficiency desired for an application. For a ferroelectric material in which the phase transition substantially occurs over, say, a temperature difference, $\Delta T$, of 1° C., the device may be used to generate electrical energy from a heat source and sink with a $\Delta T$ of that magnitude, provided $T_H$ and $T_L$ bound the phase transition temperature. The practical utility of operating with such a small temperature difference will be constrained by the Second Law of Thermodynamics. The maximum possible conversion efficiency of available thermal energy in any context is given by the Carnot efficiency, whereby $\eta_c = \Delta T/T_H$. Thus, the magnitude of the temperature difference, $\Delta T$, desired to operate the device in a practical application will depend upon the specifics of the application; engineering parameters or constraints associated with the application; the characteristics of the heat source and heat sink; the heat flux; the performance characteristics of the particular ferroelectric(s) that has the necessary phase transition temperatures; economic considerations; the practical importance of generating electricity from the particular heat source; and other considerations. While a temperature difference $\Delta T \geq 5°$ C., for example, may generally permit effective use of the invention, the temperature difference may need to be greater, or it could be less, for a particular application and materials system, based on the factors stated, among others.

It will be recognized by persons skilled in the art that some temperature gradient will exist between the ferroelectric material and the heat source that is at $T_H$ and the heat sink that is at $T_L$. While that gradient is often disregarded in quasistatic thermodynamic analyses that assume an ideal isothermal heat transfer between the working medium—which here is the ferroelectric—and the heat source and sink, the flow of heat requires some gradient in practice. For simplicity, that gradient is disregarded here and $T_H$ may be used to designate both the temperature of the heat source and the temperature to which the ferroelectric is heated. Similarly, $T_L$ may be used to designate both the temperature of the heat sink and the temperature to which the ferroelectric is cooled. In practice, the extent of the actual gradient may affect the overall thermal efficiency, power density, and other factors.

The invention is not limited or specific to any particular heat exchanger format or configuration; to any particular heat source or heat sink; nor to any particular thermal characteristics of the heat source or heat sink. Rather, the device is general and may be used to effectively convert available thermal energy to electricity and, conversely, to cool using electrical energy. Heat input and withdrawal to and from the ferroelectric to cause temperature and phase cycling can be accomplished by thermal transport through convection, conduction or radiation, and by one or two-phase heat transfer systems.

In general, different materials can be used to practice the present invention. A particular ferroelectric will be effective in converting heat to electrical energy when cycled around its phase transition temperature or temperatures. As noted, the phase transition that often will be utilized with the invention is that from ferroelectric to paraelectric and back to ferroelectric. However, the phase transition from ferroelectric to antiferroelectric and back may also be utilized with the invention. First order transitions are common among ferroelectric materials, and many first order transition materials are appropriate for use with the invention. Ferroelectric materials that exhibit second order transitions may also be used with the invention.

Criteria that affect the suitability of a ferroelectric material for a particular application include: (1) a phase transition temperature that matches the available range of thermal energy from the heat source and heat sink; (2) the sharpness of the phase transition of that material as a function of temperature; (3) the energy released during transition from a polarized state to a non-polarized state, as expressed by $U=P^2/2\epsilon\epsilon_0$ (with high permittivity ferroelectrics, spontaneous polarization in the ferroelectric state is preferably $\geqq 2$ μC cm$^{-2}$, but amorphous polymers with much lower polarization may be used since they may have very low permittivity); (4) a sufficiently high resistivity to avoid the charges on the electrodes from leaking through the ferroelectric medium before the stored electrical energy can be removed externally at high voltage; (5) the ability to pole during the transition to the ferroelectric state with a field that is comparatively small so that the poling voltage will be substantially less than the voltage at which the charge is removed (generally, it is desirable that the poling voltage be less than about 20% of the generated voltage, and preferably less than about 5%); and (6) a comparatively high ferroelectric transition energy, or enthalpy, in comparison to the energy required to heat the lattice during cycling (this factor will depend in part on the magnitude of the temperature difference between the high and low cycling temperatures).

Lead based ferroelectric materials systems, for example, provide a wide range of materials combinations, such as PZT, PZST, PLT, etc., that may be used. The particular percentage compositions of the constituent elements will affect the specific performance characteristics of the material, including the phase transition temperature. In polymer systems, the phase transition temperature can be varied and controlled by forming copolymers and blends. A list of many ferroelectrics and antiferroelectrics that may be used with the invention is set forth in M. Lines and A. Glass, PRINCIPLES AND APPLICATIONS OF FERROELECTRICS AND RELATED MATERIALS, APP. F (1977, Oxford reprint 2004), though the list is not exhaustive. That Appendix F is incorporated herein. The invention can be used with ferroelectrics that are in either solid or liquid form, the latter including, for example, liquid ferroelectrics and ferroelectric fine crystals suspended in a liquid appropriate for a particular application. Solid materials that can be used include ceramic ferroelectrics, ferroelectric polymers, and other polarizable polymers, by way of example.

Figure 16:
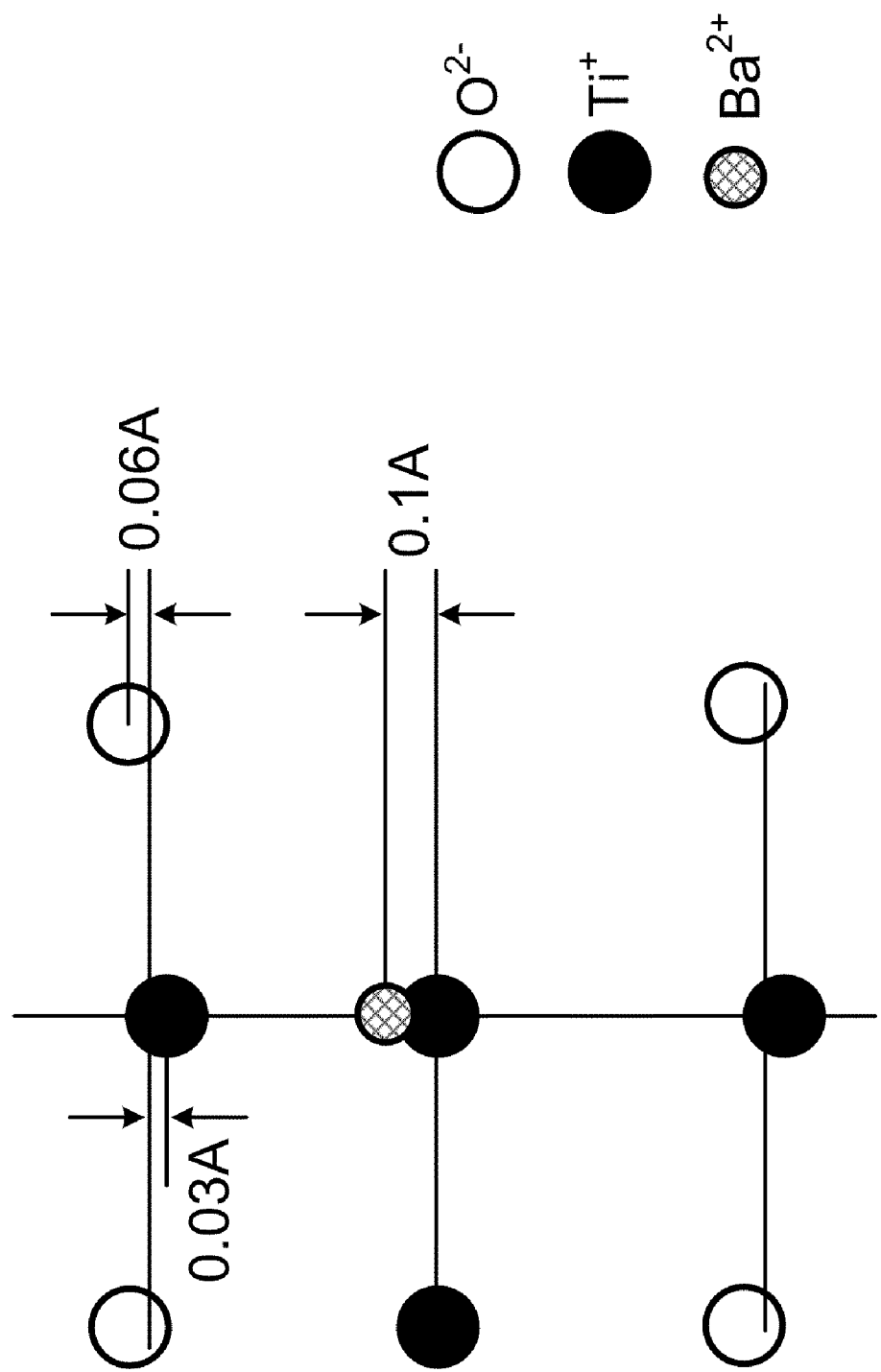
FIG. 16 illustrates the magnitude of the ionic displacements that occur in the unit cell of the Perovskite barium titanate, $BaTiO_3$, when in the ferroelectric phase and that give rise to spontaneous polarization, $P_S$.

By way of example, a number of Perovskite crystals exhibit phase transition phenomena that provide an effective ferroelectric to be used in the invention. Perovskite ferroelectrics, such as PZT or PLT, undergo mostly first order transitions from the ferroelectric to paraelectric phase when the unit cell structure undergoes transition from cubic (paraelectric phase) to tetrahedral (ferroelectric phase). FIG. 14(a) illustrates the unit cell structure for a Perovskite crystal in the paraelectric phase where the material temperature is great than $T_c$. In the example, the eight corners of the cube are occupied by lead atoms; the six faces of the cube are occupied by oxygen atoms; and the center of the cube is occupied by a titanium or zirconium atom. FIG. 14(b) depicts the shift in the relative positions of the ions when the material is in the ferroelectric phase and $T<T_c$. It is that shift that gives rise to the local electric dipole of the unit cell, and it is those electric dipoles that, in the aggregate, produce the spontaneous polarization of the ferroelectric material, $P_s$. FIG. 15 is a similar illustration of displacement and unit cell polarization for another ferroelectric, potassium niobate, $KNbO_3$, when in the ferroelectric phase. FIG. 16 illustrates the magnitude of the physical displacement, in angstroms, that may occur among the ions in the unit cell in the ferroelectric phase, which displacement gives rise to the unit cell electric dipole.

Referring to FIG. 1, a single-stage ferroelectric conversion device/apparatus 100 that utilizes the change in spontaneous polarization that occurs from temperature cycling to generate electric charges that are discharged to an external circuitry at high voltage is schematically shown according to one embodiment of the present invention. The apparatus 100 includes a ferroelectric layer 110 having a first surface 112 and an opposite, second surface 114. The ferroelectric layer 110 consists of a solid or liquid ferroelectric material that is characterized by a phase transition temperature at which the material undergoes a phase change from the ferroelectric phase to either the paraelectric or antiferroelectric phase and back again as the temperature change is reversed. The ferroelectric layer 110 may consist of a ferroelectric material that is characterized with a Curie temperature, $T_c$, such that when the temperature of the ferroelectric material is lower than the Curie temperature $T_c$, the ferroelectric material is in a ferroelectric phase in which spontaneous polarization is established in the unit cells of the ferroelectric material, and when the temperature of the ferroelectric material is greater than the Curie temperature, $T_c$, spontaneous polarization is not established in the unit cells of the ferroelectric material or is negligible. The ferroelectric layer 110 may also consist of a ferroelectric material that undergoes phase transition from ferroelectric to paraelectric as the temperature of the ferroelectric material decreases below the transition temperature. The ferroelectric layer 110 may also consist of a ferroelectric material that undergoes phase transition from the ferroelectric phase to the antiferroelectric phase at a phase transition temperature, such material changing back to the ferroelectric phase when the temperature change is reversed. The ferroelectric layer 110 has a thickness defined between the first surface 112 and the second surface 114. The thickness required in practice depends upon several parameters including the particular application and the characteristics and amount of heat available to be converted to electricity; the particular ferroelectric material utilized; and the thermal conductivity of the ferroelectric material. Typically, the thickness of the ferroelectric layer 110 in one stage of the apparatus 100 is between about 0.01 mm and about 1 cm. Other values of the thickness can also be utilized to practice the invention. The ferroelectric layer 110 may be planar in shape or of any other shape, its configuration being limited only by manufacturing technology and operational considerations for the device.

The width and length of the ferroelectric layer 110 is determined by the nature of the ferroelectric material, the particular application, the characteristics and amount of heat available to be converted to electricity, the heat transfer mechanism, and other factors. There is no theoretical limit on the width and length of the ferroelectric layer 110. Limitations are practical manufacturing limitations that may exist from time to time for a particular ferroelectric material and operational factors of a particular application. Where the width and length of the ferroelectric layer 110 is limited by practical considerations, a number of similar or identical devices can be arranged in an array or in a stack to effectively expand the surface available for communication with the heat exchangers that interface the device depicted in FIG. 1 with the heat source and heat sink. In such an application, the conductive leads from the electrodes may be joined to electrical buses, and the cumulative array would then act as a larger device having an area approximately equal to the total area of the individual devices, thereby permitting generation of electric power limited only by the quantity and character of the available thermal energy. One example of such an array is illustrated by FIG. 8.

A pair of electrodes 122 and 124 is respectively positioned on the first surface 112 and the second surface 114 of the ferroelectric layer 110. The electrodes 122 and 124 consist of a thermally and electrically conductive material. Such electrodes 122 and 124 are substantially in contact with the first and second surfaces 112 and 114 of the ferroelectric material/layer 110 so as to provide electrical contact and maximize thermal conductivity. The pair of electrodes 122 and 124 may be comprised of, for example, a thin coating of silver of a thickness sufficient to permit the conduction of the current that is generated, but sufficiently thin to minimize interference with thermal conductivity between the heat exchangers and the ferroelectric material. The thickness of the silver electrodes can be about 1-5 microns, for example. In some embodiments, it may be desirable to have the electrode set back slightly from the edges of the ferroelectric layer 110 by, for example, 1 mm, to avoid electrical discharge around the edge of the ferroelectric layer 110.

Additionally, the apparatus 100 includes means positioned in relation to the pair of electrodes 122 and 124 for alternately delivering 140 heat to and from the first surface 112 and the second surface 114 of the ferroelectric layer 110 so as to alternately cool the ferroelectric layer 110 at a first temperature $T_L$ that is lower than the transition temperature, and heat the ferroelectric layer 110 at a second temperature $T_H$ that is higher than the transition temperature, so that the ferroelectric material of the ferroelectric layer 110 thereby undergoes, with temperature cycling, alternating phase transitions between (1) the ferroelectric phase and (2) the paraelectric or antiferroelectric phase. In this exemplary embodiment, the delivering means comprises two heat exchangers 132 and 134 in fluid communication with a heat source and a heat sink (not shown) for inputting heat from the heat source to the ferroelectric layer 110 so as to heat the ferroelectric layer 110 at the second temperature $T_H$, and withdrawing heat from the ferroelectric layer 110 to the heat sink so as to cool the ferroelectric layer 110 at the first temperature $T_L$. This absorption and rejection of thermal energy is integral to satisfying the Second Law of Thermodynamics, which permits conversion of thermal energy to another form of energy, or to work, only through a process of heat absorption and heat rejection.

The apparatus 100 also has a pair of electric leads 152 and 154 electrically connected to the pair of electrodes 122 and 124, respectively, such that when the ferroelectric material of the ferroelectric layer 110 is in a metastable state, the circuit can be closed and a DC voltage can be applied between the pair of electric leads 152 and 154 to pole the domains of the ferroelectric material, thus enabling a very large overall net spontaneous polarization to develop in the ferroelectric layer as it transitions from a metastable state to a stable ferroelectric state. That overall net spontaneous polarization in turn induces very dense electrically-opposite screening charges respectively on the pair of electrodes 122 and 124. The circuit is then opened while the ferroelectric material of the ferroelectric layer 110 is heated to temperature $T_H$ through the addition of heat to the lattice, while total polarization remains constant at $P_H$ because the circuit is open so as to prevent discharge of the charges on the electrodes. The circuit is then closed while heat is added to the ferroelectric layer isothermally, causing the electrically-opposite screening charges to discharge to the pair of electric leads 152 and 154 at a voltage that is much higher than the applied DC poling voltage. The pair of electric leads 152 and 154 allows the connection of the DC power supply for poling purposes, and permits the conduction of the discharge current from the electrodes to whatever external load may be used or to busses to collect and distribute the electricity generated by multiple devices. An external voltage need not be applied between the pair of electric leads 152 and 154 other than for poling.

Figure 2:
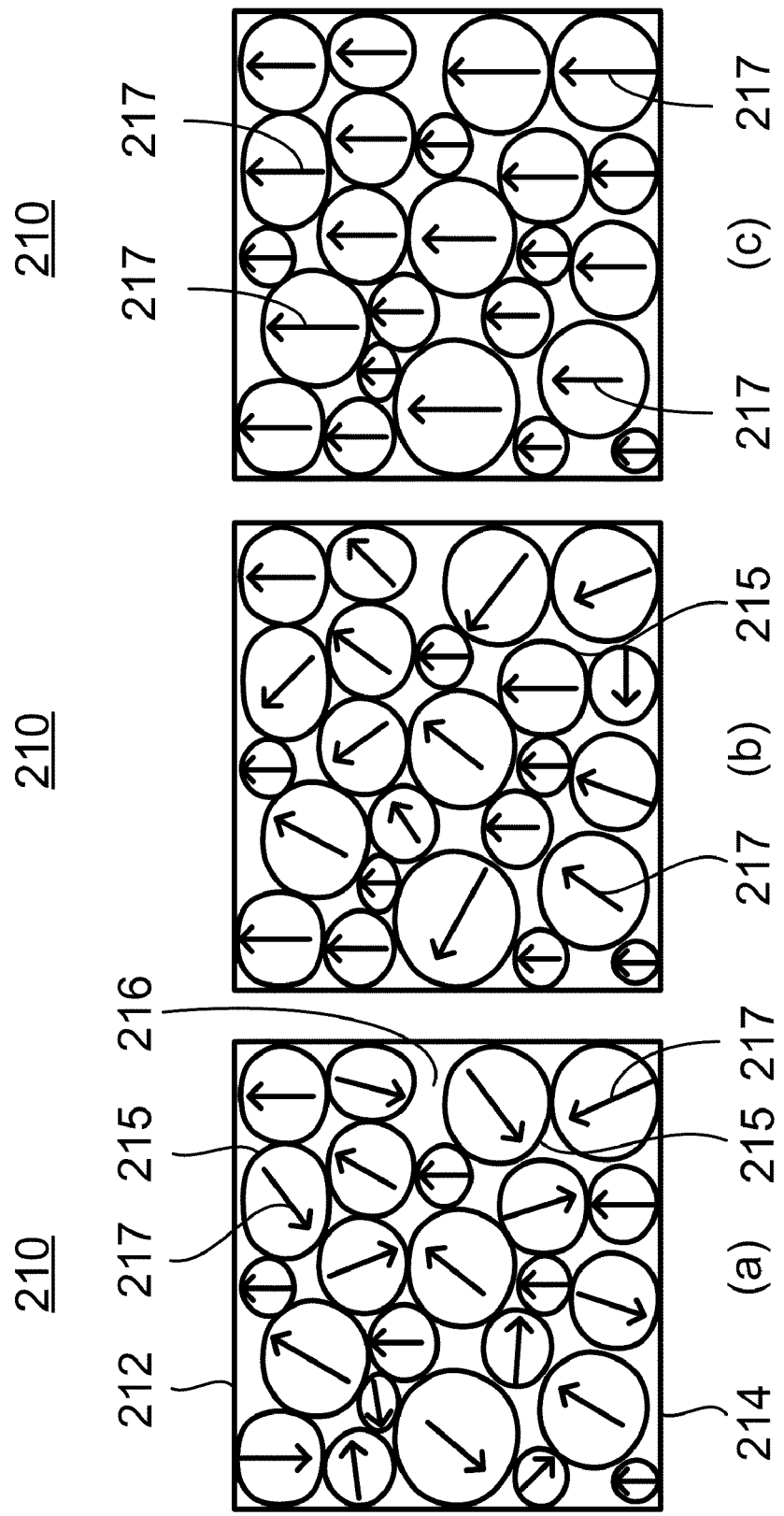
FIG. 2 illustrates schematically the alignment of the domains in a ferroelectric where (a) illustrates unpoled, random orientation, with each domain consisting of a large number of electric dipoles that would be similarly oriented within that individual domain; (b) illustrates a substantially poled material where the dipoles are oriented in the same overall direction; and (c) illustrates an ideal, completely poled ferroelectric that is generally attained only under special conditions pertaining to the atomic and molecular structure of the material.

FIG. 2 shows schematically the alignment of the domains 215 in a ferroelectric 210 in the ferroelectric phase, i.e., the temperature of the ferroelectric 210 is lower than the Curie temperature $T_c$ of the ferroelectric 210. The ferroelectric 210 has a first surface 212 and an opposite, second surface 214 defining a ferroelectric layer body 216 there between. The ferroelectric layer body 216 is characterized with a plurality of domains 215 having a large number of unit cells or polarizable units as in polymers. As shown in FIG. 2(a), each domain 215 is characterized by a spontaneous polarization indicated by a dipole arrow 217, but randomly orientated so that there is no overall net spontaneous polarization in the ferroelectric 210. FIG. 2(b) shows the dipoles 217 aligned towards the same overall direction, so that a very powerful net spontaneous polarization exists in the ferroelectric 210. Such alignment can be achieved by applying a poling field to the ferroelectric layer body 216. FIG. 2(c) illustrates an ideally aligned ferroelectric that generally is attained only under special conditions pertaining to the crystal structure of the material.

The electrical energy that can be extracted by exploiting changes in spontaneous polarization during thermal cycling of a given ferroelectric can be calculated from the Landau phenomenological model of material systems in and around phase change. Such modeling is a more comprehensive thermodynamic representation of the system than traditional quasi-static thermodynamic analysis. The latter is effectively restricted to equilibrium conditions, whereas Landau modeling is a broader dynamic representation that includes non-equilibrium conditions. For ordinary ferroelectrics, the Landau-Ginzburg-Devonshire free energy functional expresses the free energy of a ferroelectric material system in terms of the independent parameters temperature, T, and the order parameter, P, which represents the total polarization produced by the dipoles in the system, both spontaneous and induced. The Landau-Ginzburg-Devonshire free energy functional is expressed as:

$$G(T,P) = \alpha_1(T) \cdot P^2 + \alpha_{11} \cdot P^4 + \alpha_{111} \cdot P^6$$

where G is the free energy functional. G is in units of J/m³, and P is in units of C/m². Polarization is a thermodynamic variable, and it represents the full polar system described by G(T, P). The α parameters are specific to a given material system, and for those given parameters, the Landau-Ginzburg-Devonshire free energy functional provides the full information for the thermal cycles of a ferroelectric through and around phase transition, and for polarizable polymer systems through and around their depolarization transitions.

Figure 17:
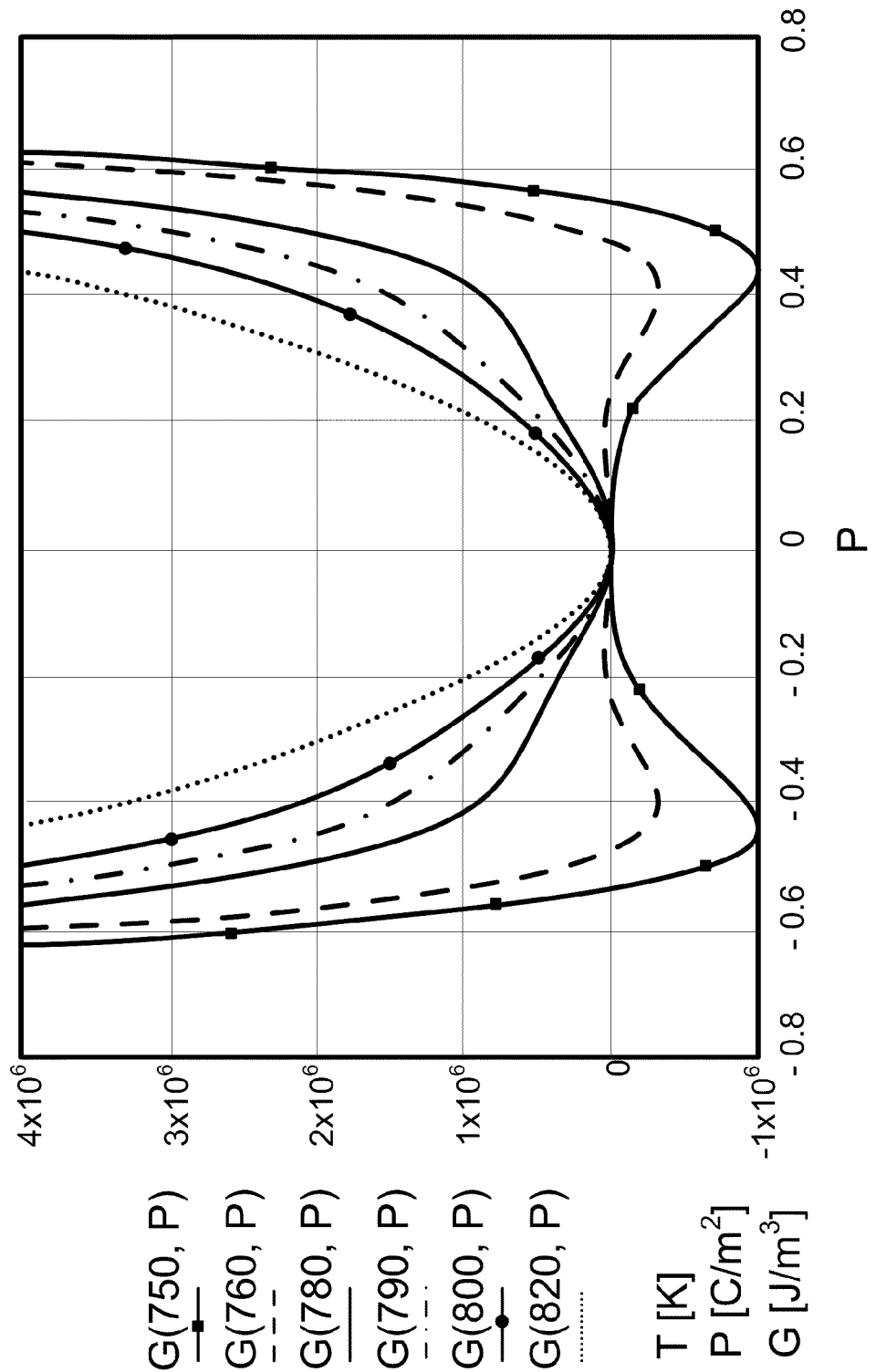
FIG. 17 is a plot of the free energy functional in terms of temperature, T, and polarization, P, using parameters for a sample of lead titanate, $PbTiO_3$. G is the Gibbs free energy. Temperature is measured in Kelvin; polarization in $C/m^2$; and the free energy, G, in $J/m^3$. Polarization is a full thermodynamic variable, and it represents the full polar system described by G(T, P).

FIG. 17 is an example of plots of the free energy functional in terms of temperature, T, and polarization, P, with the material parameters representative of a sample of lead titanate, PbTiO₃, with $T_c$ 766 K. Polarization is a full thermodynamic variable, and it represents the full polar system described by G(T, P). The individual plots are for various temperatures of the material. The free energy value, G, is measured in J/m³. G is assigned the value of 0 when the material is in a nonpolar state—i.e., where P=0. The free energy, G, is then plotted as calculated from the Landau-Ginzburg-Devonshire functional for various temperature values from 750K to 820K. For temperatures above the transition temperature, the free energy is never below the reference value assigned for the material in the paraelectric state. The global minima in the various plots represent equilibrium states.

Where a material is in its ferroelectric phase, the system will have two free energy minima, one at each of the low points of the two wells. Each of those equilibrium points is equally likely in the absence of a field, and the decrease in free energy is the same in both wells because the material system is symmetrical. By poling the dipoles as the material system enters the ferroelectric phase, the system is biased so that the system will drop down into the particular well that corresponds to the poled orientation. Poling does not materially affect the free energy of the system.

Figure 18:
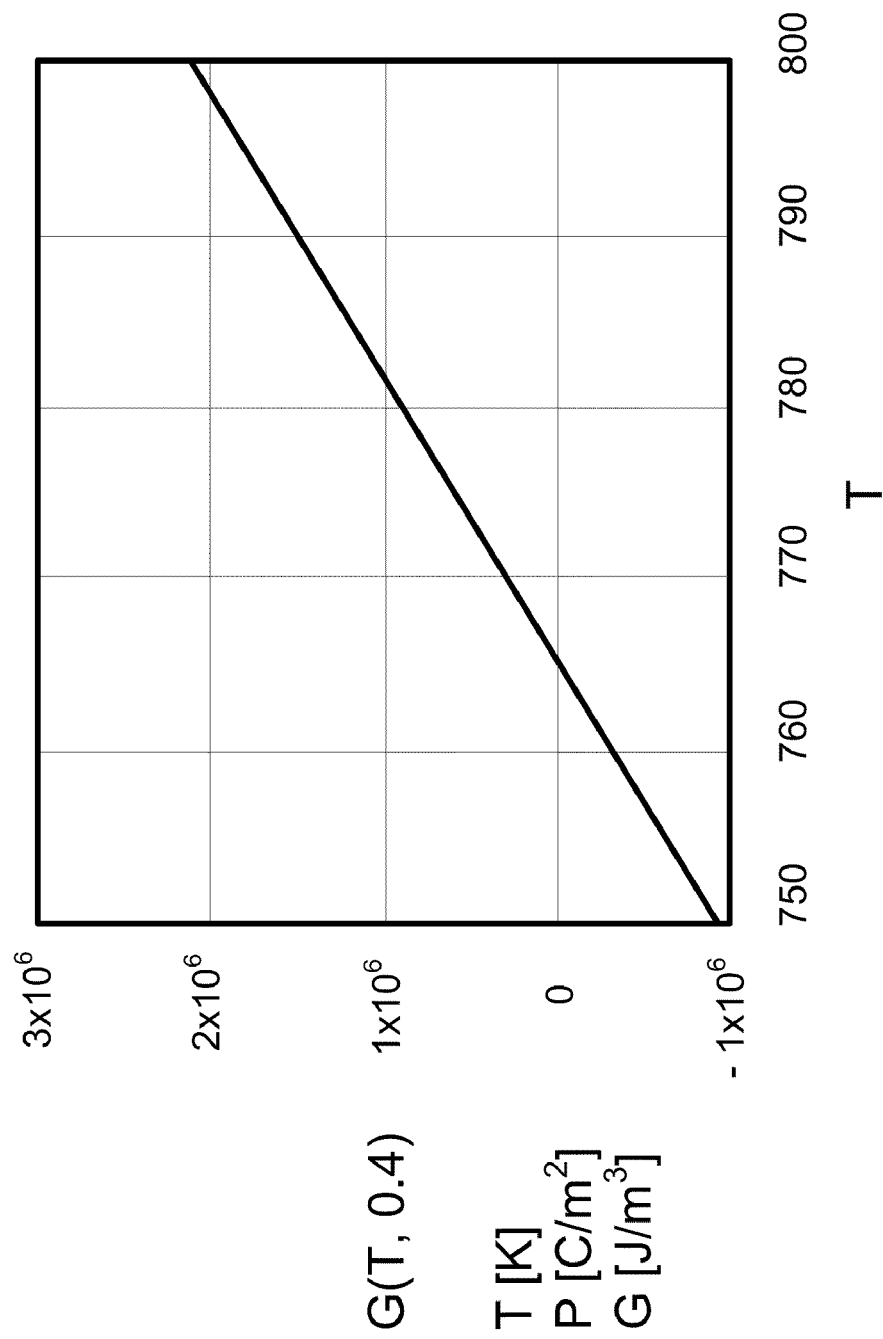
FIG. 18 is a plot of free energy as a function of temperature for a sample of lead titanate, $PbTiO_3$. Polarization is constant at $P=0.4$ $C/m^2$.

FIG. 18 is a plot of free energy as a function of temperature where polarization is held constant at 0.4 C/m². Again, the parameters used in plotting the free energy functional are those characteristic of a sample of lead titanate with $T_c$ 766K. This linear relationship between free energy and temperature can be a consideration in determining the appropriate thermodynamic cycling of the ferroelectric material used in the invention. FIG. 18 indicates that it may be desirable in some instances to cycle the ferroelectric over a wide temperature range since the change in free energy increases as the temperature range of the cycle increases. Ideally, this can be performed as a perfect Carnot engine providing the highest possible efficiency. The thermal efficiency realized by cycling over the wider temperature range may decrease, however, because of increased lattice heat contribution for the wider temperature cycling if perfect regeneration cannot be performed. It should also be recognized that the accuracy of the Landau-Ginzburg-Devonshire model generally decreases as temperature departs farther from the phase change temperature, so the linear relationship may not be as accurate over large temperature ranges.

Figure 19:
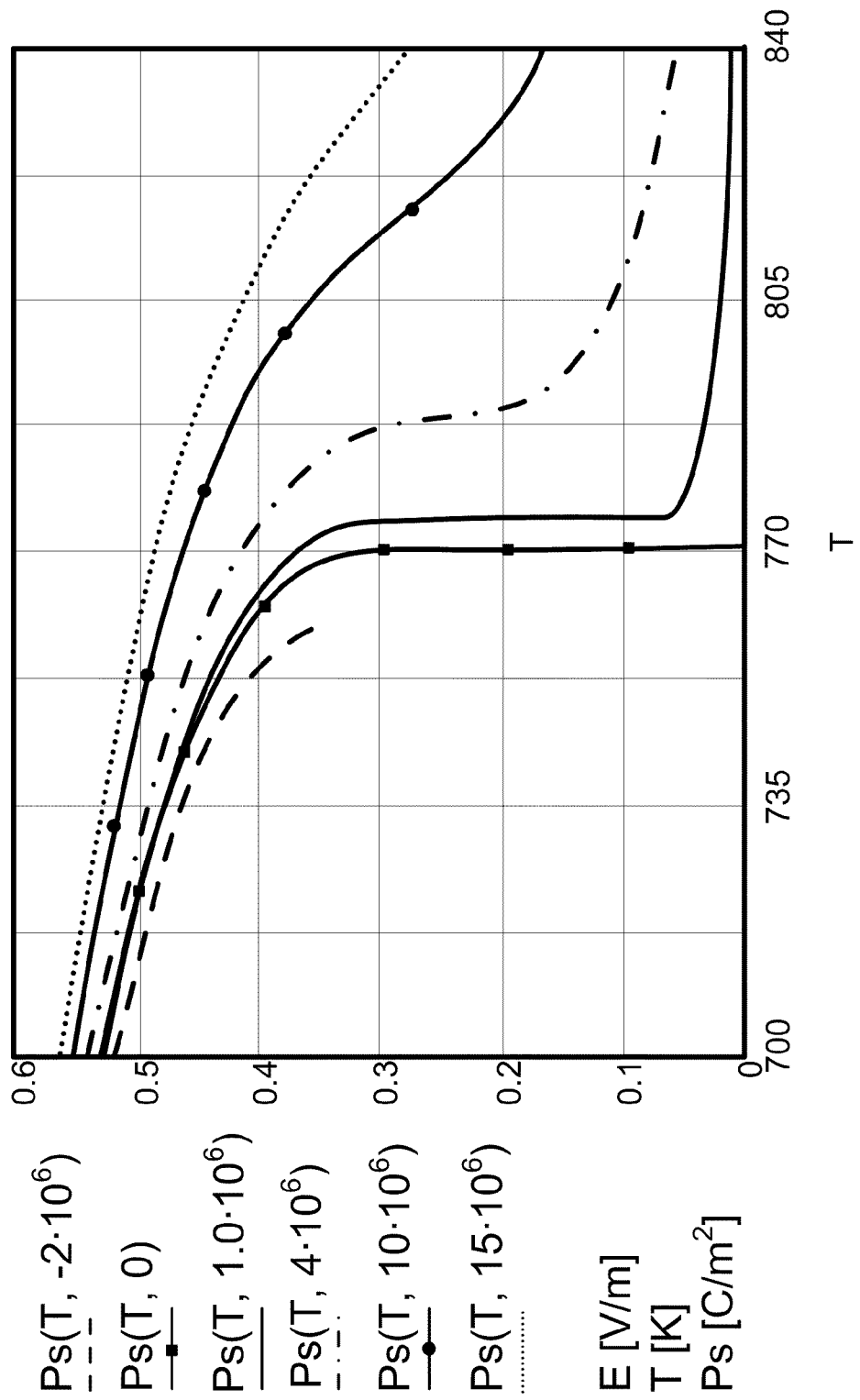
FIG. 19 is a plot of polarization at various electric field values, E. Temperature is measured in Kelvin, and the E field value is in volts per meter.

FIG. 19 presents plots of spontaneous polarization versus temperature for various electric field values for the same lead titanate parameters. The relationship between E; free energy, G; P; and T, is derived from the free energy functional and can be expressed as:

$$E = \alpha G/\alpha P = 2\alpha_1(T)P + 4\alpha_{11}P^3 + 6\alpha_{111}P^5.$$

In the case of the present invention, the E values represent the field generated by the unscreened charges on the electrodes that are on the surfaces of the ferroelectric layer, as well as the small field that is applied from the DC voltage source for poling.

Figure 20:
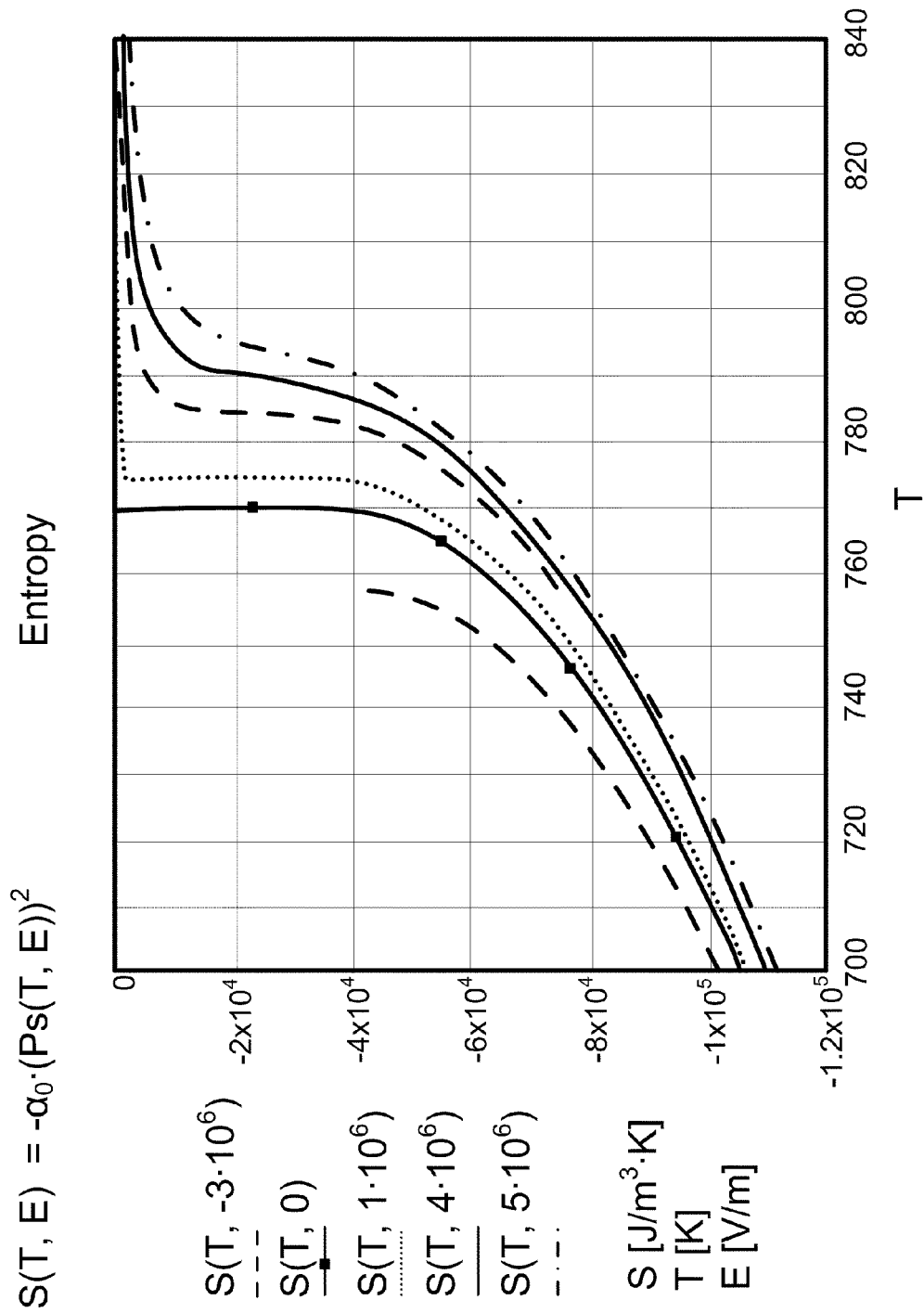
FIG. 20 is a plot of entropy for a sample of lead titanate, $PbTiO_3$, as a function of temperature for various E field values. Temperature is measured in K, and entropy is measured in units of $J/m^3 \cdot K$.

FIG. 20 is a plot of entropy, S, as a function of temperature for various E values where the parameter E is measured in volts per meter. Entropy is proportional to P², and $$S = -\alpha_0 [P_S(T,E)]^2$$

where entropy is measured in J/(m³ K). The parameter $\alpha_0$ is related to the material parameters by the expression $$\alpha_1 = \alpha_0(T - T_0),$$

where $T_0$ is the Curie-Weiss temperature, which is the phase transition temperature for materials that have second order phase transitions, but has a different value for first order transition materials.

Figure 22:
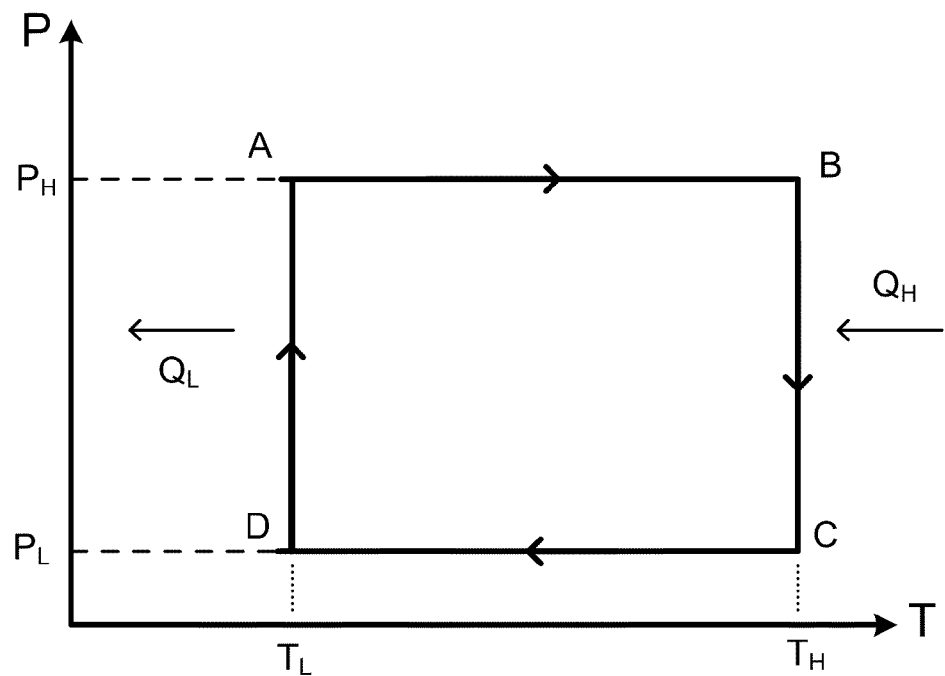
FIG. 22 is an illustration of a thermodynamic cycle of a ferroelectric wherein two steps are isothermal and two are iso-polarization. $Q_L$ and $Q_H$ indicate the removal and addition of heat, respectively, during the isothermal steps.

The thermodynamic cycle of the present invention is depicted in FIG. 22 in an ideal form. It has two isothermal steps, DA and BC, and two steps where polarization is held constant, CD and AB. Such a cycle can be used to achieve a high output of electrical energy per cycle. The specific operation of this cycle is described in more detail herein.

Starting at an arbitrary point of the cycle, C, the material is at a relatively high temperature, $T_H$, and in a paraelectric or antiferroelectric phase. Total polarization is at a minimum value, $P_L$, which is negligible or zero. The electrodes on the surfaces of the ferroelectric have discharged at point C so that they have negligible or no unbound charge on them. Then, during the CD step of the cycle, the ferroelectric is cooled to a relatively low temperature, $T_L$, while the electrical circuit is open so that total polarization remains constant at the minimum value, $P_L$, which is zero if the ferroelectric is completely non-polar at point C. The heat withdrawn during the CD step corresponds to the sensible lattice heat to cool the material. The ferroelectric material is in a metastable state at point D.

The circuit is closed at point D of the cycle. During the DA step, heat $Q_L$ is withdrawn isothermally while the ferroelectric is at $T_L$ until the spontaneous polarization attains the maximum value, $P_H$. That value of $P_H$ may be as great as is permitted by the particular ferroelectric material system without causing electrical breakdown or significant electrical leakage through the ferroelectric layer. All other things being equal, attaining high $P_H$ values will generally correspond to larger output of electrical energy in each cycle. $P_H$ will vary depending upon the ferroelectric material system, the configuration of the ferroelectric layer and other factors. In the illustrative case of a lead titanate sample, $P_H$ may have a value of 0.4 C/m² as shown in FIG. 21.

During the DA step, the electrical circuit is closed so that a current flows from the electrode on one side of the ferroelectric to the electrode on the opposite side of the ferroelectric until screening charges develop that equal the opposing bound charges on the surfaces of the ferroelectric. Also during the DA step of the cycle, a small poling field is applied so that the resulting dipoles are biased in one orientation—i.e., they become poled. That small poling field may be applied by the application of an external field from a DC voltage source. The heat $Q_L$ withdrawn during the DA step corresponds approximately to the latent heat of the phase transition. During the DA step, the material system relaxes from a metastable state at point D to a stable state at point A.

Figure 21:
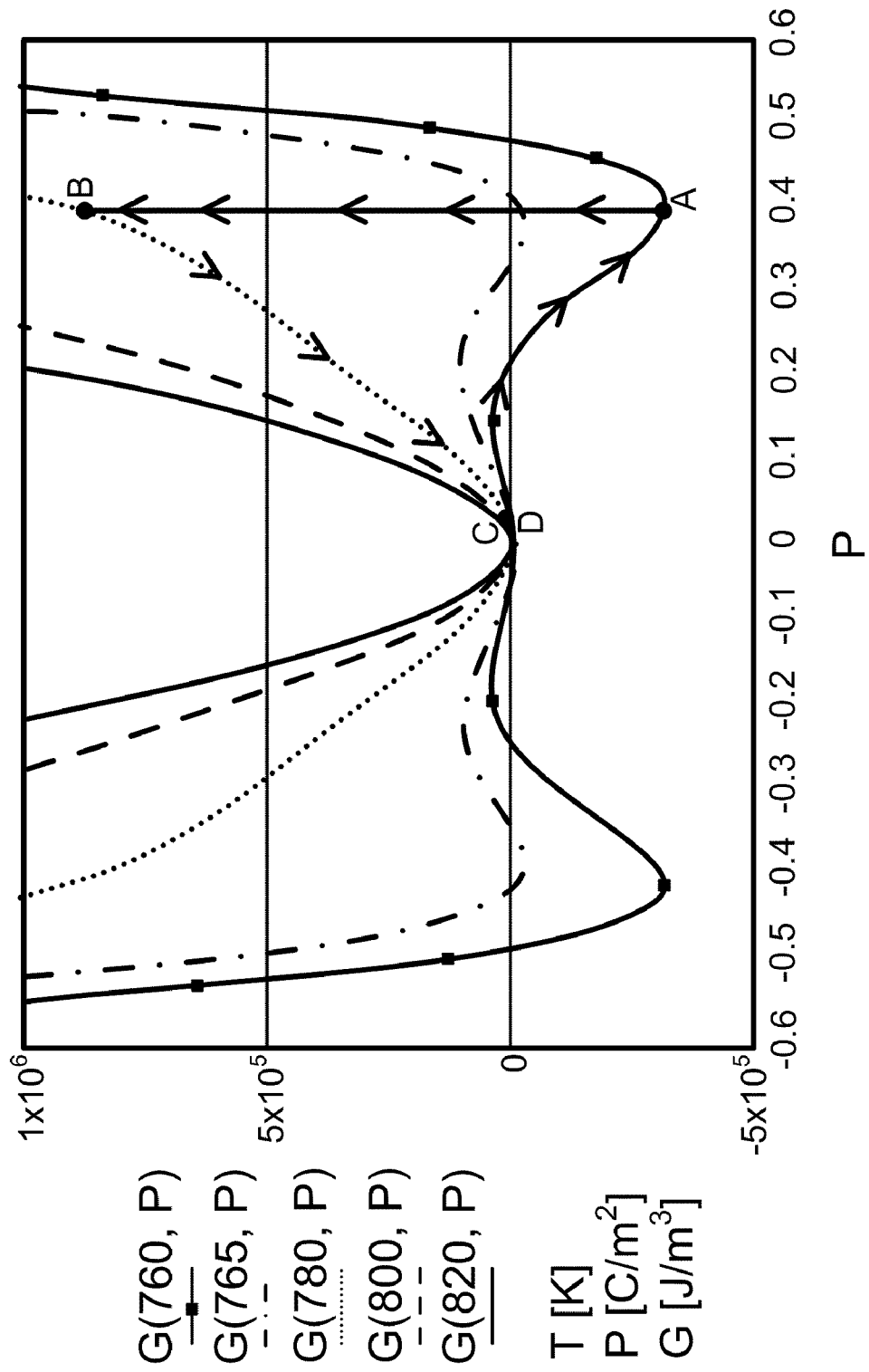
FIG. 21 is a plot of free energy for various temperature values as a function of polarization. Superimposed on the plot are the steps of a thermodynamic cycle that is disclosed by the present invention. Polarization is a full thermodynamic variable, and it represents the full polar system described by G(T, P).

In another embodiment, the small poling field can be turned off during the DA step, before point A is reached, after passing the local free energy maximum that occurs on the $T_L$ isotherm between points D and A, as depicted in FIG. 21. The system can then relax spontaneously, in the absence of an applied poling field, to point A. The location of the local free energy maximum depends on the ferroelectric material system. By way of example, for a ferroelectric sample of $PbTiO_3$ at T≅760 K, $P_L$≅0.15 C/m² generally creates an adequate poling field, as indicated in FIG. 21. Turning off the poling field while the ferroelectric layer is at $T_L$ during the DA step in this fashion requires that the impedances of the system and the load be matched so that the depolarization field does not exceed the coercive field at any time after the external poling field is turned off. Electricity generated during the DA step may be used in one embodiment by the switch S1 being switched to position B in FIG. 6 when the poling field is turned off. Utilization of the electricity so generated during the DA step may be facilitated by including a full-wave rectifier (not shown) in the circuit when the switch S1 is in position B. Such a rectifier causes current flows to and from the electrodes 822 and 824 to have the same direction at the load RL whether the current occurs during the BC or DA steps of the cycle. Such a full-wave rectifier may consist, for example, of a bridge circuit. Rectifying the signal in this fashion may simplify the subsequent use or storage of the electrical energy generated during cycling.

In the next step of the cycle, AB, the circuit is open and the ferroelectric is heated to $T_H$ above the material transition temperature at constant polarization. The heat input during the AB step corresponds to the sensible lattice heat to heat the material to $T_H$. The same quantity of heat is input in this step as is removed in step CD to cool the lattice, thus permitting perfect regeneration and attainment of Carnot efficiency.

At point B of the cycle, the ferroelectric is again in a metastable state, and the circuit is closed. Heat is input isothermally as polarization is reduced to $P_L$ during the BC step of the cycle. The heat $Q_H$ added during the BC step is equal to the enthalpy change that corresponds to the change in polarization. During that step, screened charges on the electrodes become unscreened and are largely or entirely discharged into external circuitry to perform electrical work. Total polarization at point C is again reduced to $P_L$, which is negligible or zero.

A control circuit operating under computer control is used to cause the addition and withdrawal of heat in accordance with the various steps of the cycle. The control circuit, acting under computer control, also causes the electrical circuit to open and close, and the DC poling voltage to be applied or removed, in accordance with the cycle.

The transitions of the material system from the stable state to the metastable state or vice versa during the several steps of the cycle is well described by Landau-Khalatnikov time dependent phase transition theory, which can be used to match the response time of the load to the transition time from the metastable state.

$T_H$ and $T_L$ are above and below the transition temperature, respectively, so as to allow for phase change. Depending upon characteristics of the material, such as the homogeneity of the crystal structure, for example, $T_H$ and $T_L$ may differ from the transition temperature by a few degrees centigrade or less. $T_H$ and $T_L$ may also differ from the transition temperature by a substantial amount, for example, by 20 degrees centigrade or more.

The cycle of the present invention causes changes in polarization and the input and withdrawal of heat to and from the ferroelectric to occur only when the ferroelectric is at the temperature extremes, $T_H$ and $T_L$. Only lattice heat is added or withdrawn at temperatures intermediate to $T_H$ and $T_L$. Cycling in this manner can enhance thermal efficiency because the efficiency of a thermodynamic cycle generally decreases when heat is input to or withdrawn from the working medium—which here is the ferroelectric—at temperatures intermediate to the maximum and minimum temperatures that correspond to the temperatures of the heat source and heat sink, respectively. That follows from the Second Law of Thermodynamics, the general relationship between entropy change and heat (dQ=TdS), and the fact that entropy remains constant if total polarization is constant. Ignoring the sensible heat input and withdrawn during heating and cooling, the cycle described in FIG. 22 is isentropic and thus attains the Carnot limit in ideal implementation.

It will be recognized by persons skilled in the art that the depiction of the four-step cycle disclosed by the invention depicts a cycle performing in an ideal fashion. In practice, there generally may be deviations from ideal or perfect isothermal or constant polarization steps of the cycle. It is not the intent of the invention to be limited to an ideal or perfect cycle, but instead to disclose the apparatus and method of the cycle generally, recognizing that the invention will generally be practiced such that the actual cycle may depart to some extent from the ideal.

As noted elsewhere, in some embodiments of the invention the ferroelectric phase occurs at a temperature higher than the transition temperature, and the paraelectric phase, or antiferroelectric phase, occurs below the transition temperature. In such embodiments, the cycle depicted in FIG. 22 operates the same except in the opposite direction. The four steps are DC, CB, BA, and AD. Steps DC and BA occur at constant polarization, $P_L$ and $P_H$, respectively. Only lattice heat is input and withdrawn, respectively, during steps DC and BA. Heat $Q_H$ is input isothermally during step CB, and heat $Q_L$ is withdrawn isothermally during step AD. During step CB, the electrical circuit is closed; poling with a DC voltage occurs; and a current flows from the electrode on one side of the ferroelectric to the electrode on the opposite side until screening charges develop that equal the opposing bound charges on the surfaces of the ferroelectric. The electrical circuit is closed and electricity is discharged to a load during step AD.

In yet another embodiment of the present invention, heat can be converted to electricity using a cycle in which the ferroelectric material does not strictly enter a paraelectric or antiferroelectric phase. Rather, a cycle can be used whereby the ferroelectric material remains in its ferroelectric phase at all times, but is cycled from a greater degree of polarization to a lesser degree of polarization. In this embodiment, the cycle depicted in FIG. 22 is the same, but $T_H$ is not sufficient to cause the material to become strictly paraelectric or antiferroelectric. The minimum $P_L$ in this implementation will be some value greater than zero. Its specific value will depend on the material system and $T_L$, and specifically on how far $T_L$ is from causing a complete transition out of the ferroelectric phase.

The robustness of a particular thermodynamic cycle can be evaluated using values calculated from the free energy functional. FIG. 21, like FIG. 17, is an example of plots of the free energy functional in terms of temperature, T, and polarization, P, with the material parameters representative of a sample of lead titanate, PbTiO$_3$, where T$_c$ 766 K. The individual plots are for various temperatures of the material. FIG. 21 includes designations of the points of the cycle (A, B, C and D) depicted in FIG. 22 and described herein where there are two isothermal steps and two steps where polarization is virtually constant. The values for T and P in FIGS. 21 and 22 are illustrative only and are not intended to suggest that they are ideal or unique.

Figure 23:
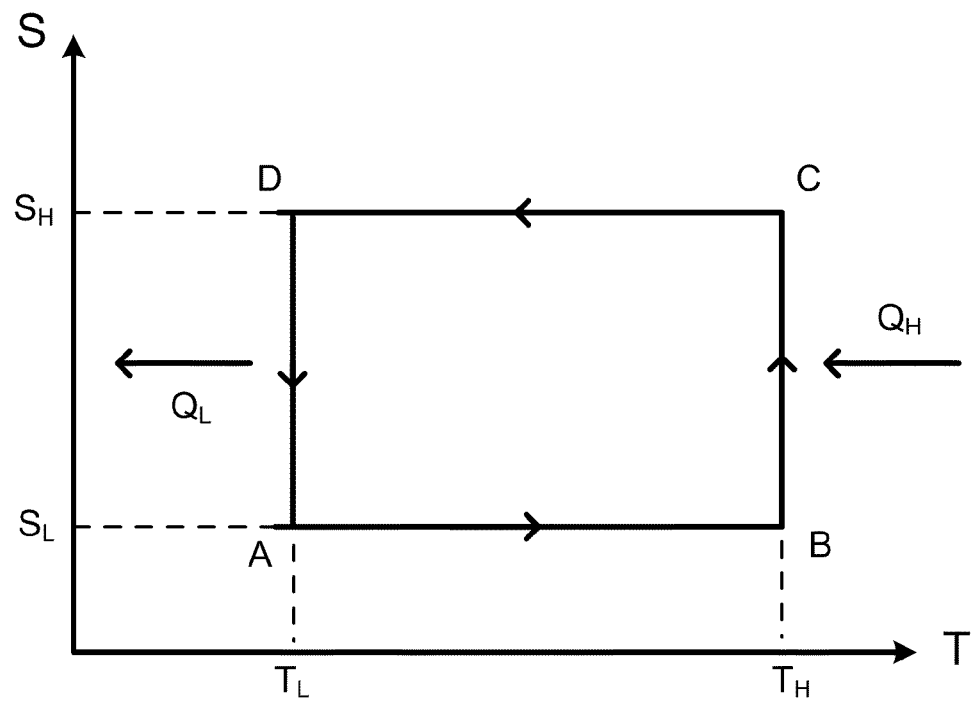
FIG. 23 illustrates entropy as a function of temperature for the cycle depicted in FIG. 22. Only the polarization contribution to free energy is considered. Other degrees of freedom, such as lattice heat and polymer backbones, are disregarded.

FIG. 23 illustrates entropy as a function of temperature for the cycle depicted in FIG. 22. Only the polarization contribution to free energy is considered. Other possible degrees of freedom that could contribute to entropy changes, such as lattice heat and polymer backbones, are disregarded in the illustration. Where those other factors are negligible, the cycle is isentropic even in the absence of regeneration.

Figure 3:
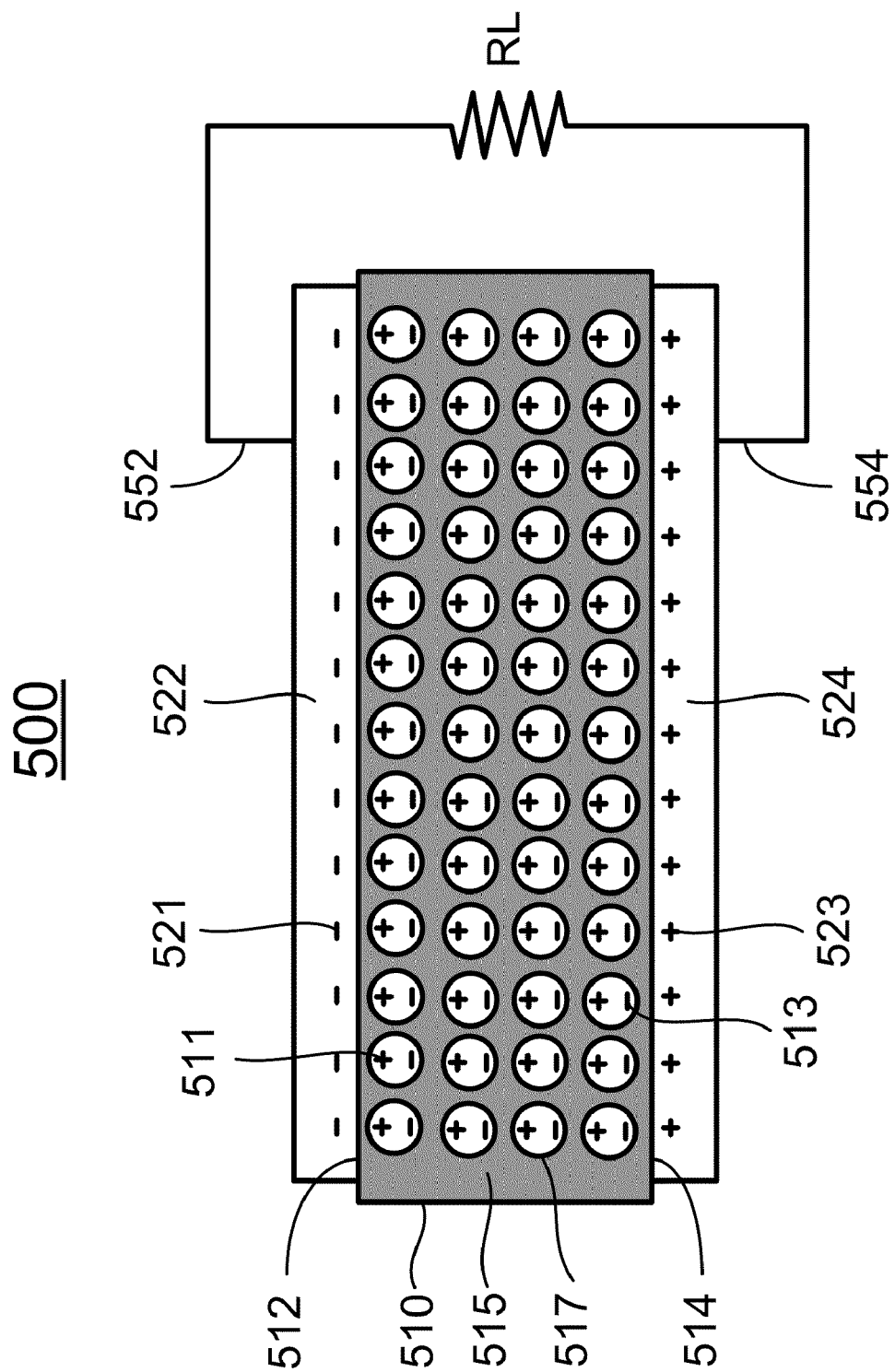
FIG. 3 illustrates schematically bound charges on the surfaces of a ferroelectric structure/layer and the opposing screening charges that are induced on the adjacent surfaces of the electrodes when there is substantial net spontaneous polarization, $P_s$, which may be denoted as $P_r$ in the absence of an external field.

FIG. 3 shows schematically a ferroelectric module 500 in the ferroelectric phase with bound surface charges generated on the surfaces of the ferroelectric layer 510 and corresponding screening charges generated on the electrodes 522 and 524. In the exemplary embodiment, the electric dipoles 517 are aligned, for example, by a small poling field, thereby enabling a large overall net spontaneous polarization to occur in the ferroelectric layer 510. The resulting large net spontaneous polarization produces very dense bound charges 511 and 513 on the surfaces 512 and 514 of the ferroelectric layer 510. As a result, a current flows to the electrodes 522 and 524. Screening charges 521 and 523 are thereby produced on the electrodes 522 and 524 that equal, but are opposite in charge to, the bound charges 511 and 513 at the surfaces 512 and 514 of the ferroelectric layer 510. At that point, the net electric field in the electrodes 522 and 524 is necessarily negligible or zero since the electrodes 522 and 524 are conductors. The bound charges 511 and 513 in the ferroelectric layer 510 result from the aligned electric dipoles 517 and P$_s$, while the screening charges 521 and 523 on the electrodes 522 and 524 result, in turn, from the bound charges 511 and 513, and are in opposition to those bound charges 511 and 513.

As the ferroelectric goes through phase transition and becomes paraelectric or antiferroelectric, the spontaneous polarization in the ferroelectric layer 510 disappears. As a result, the screening charges 521 and 523 on the electrodes 522 and 524 become unscreened at an extremely high potential difference between the electrodes 522 and 524. The exact potential difference will depend upon the particular ferroelectric and the configuration of the module, but potentials in excess of 30,000 volts may be attained with appropriate materials before dielectric breakdown.

Figure 4:
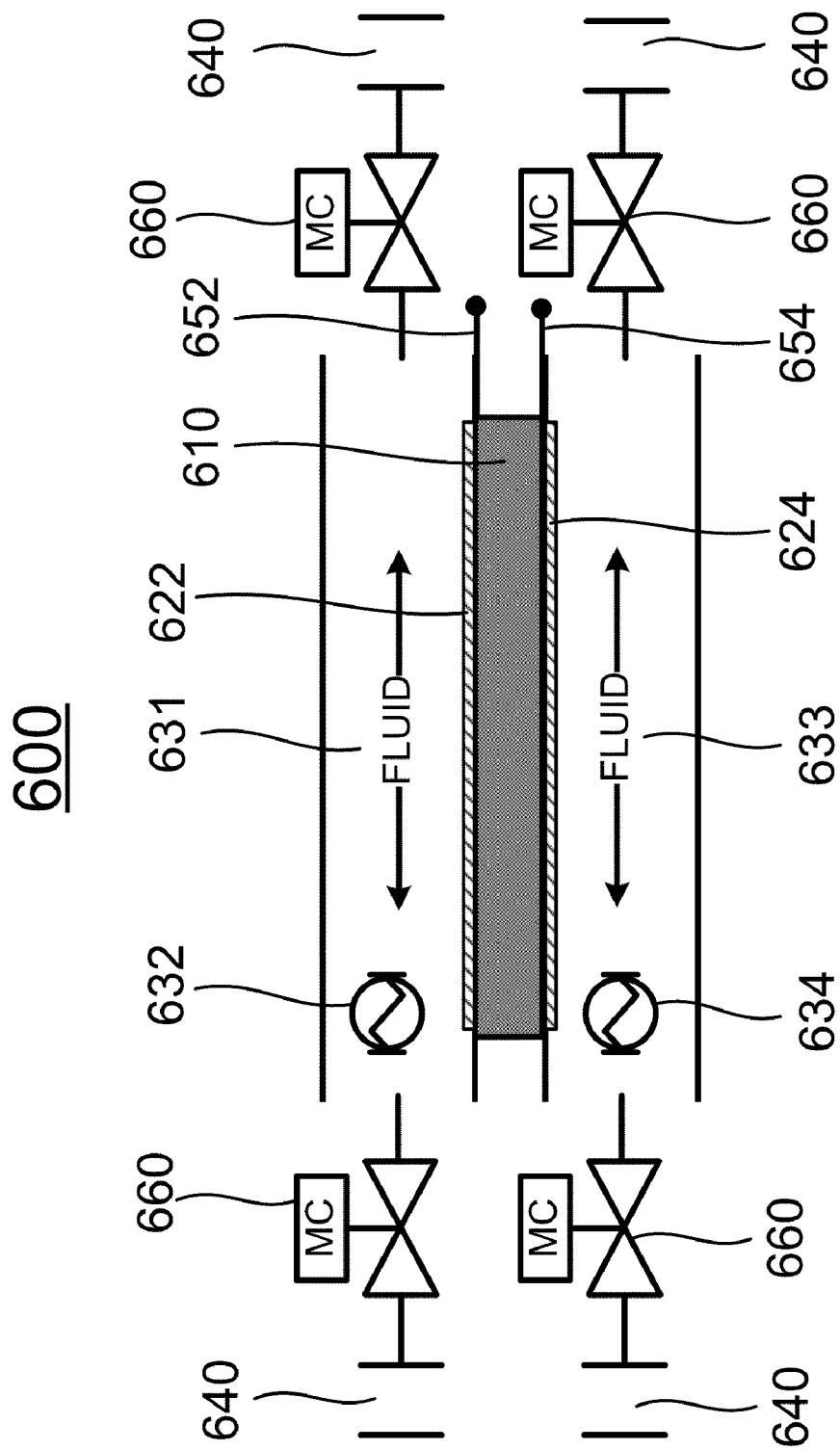
FIG. 4 shows schematically a cross-sectional view of a ferroelectric device for converting heat to electric energy according to another embodiment of the present invention.
Figure 5:
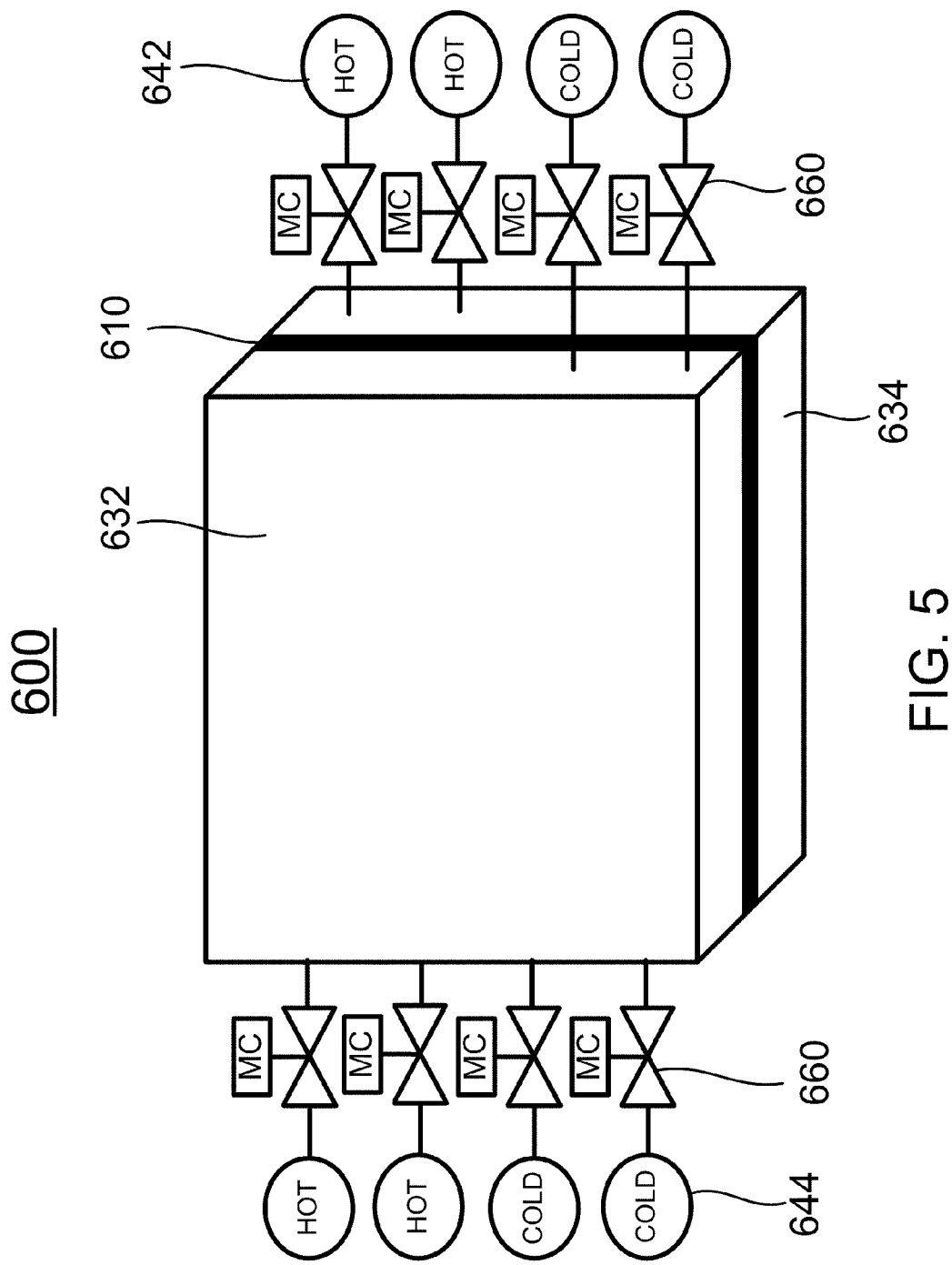
FIG. 5 shows schematically a perspective view of the ferroelectric device as shown in FIG. 4.

FIGS. 4 and 5 show another embodiment of a heat-to-electric conversion device 600 according to the present invention. In the exemplary embodiment, the device 600 has a ferroelectric layer 610, a pair of electrodes 622 and 624 respectively formed on the surfaces of the ferroelectric layer 610, and a delivering means in relation to the pair of electrodes 622 and 624 for alternately delivering a cold fluid and a hot fluid over the surface of the ferroelectric layer so as to alternately cool the ferroelectric layer 610 at a first temperature T$_L$<T$_c$, and heat the ferroelectric layer 610 at a second temperature T$_H$>T$_c$; thereby the ferroelectric material of the ferroelectric layer 610 undergoes alternating phase transitions between the ferroelectric phase and the paraelectric or antiferroelectric phase with temperature cycling.

As shown in FIG. 4, the delivering means has a first fluid passage 631 and a second fluid passage 633, a number of heat exchangers 632 and 634 including the first and second fluid passages 631 and 633, and a plurality of control valves 660 in communication with the heat exchangers 632 and 633.

The first fluid passage 631 and the second fluid passage 633 are configured such that when a cold fluid passes through at least one of the first and second fluid passages 631 and 633, the ferroelectric layer 610 is cooled towards the first temperature T$_L$, and when a hot fluid passes through at least one of the first and second fluid passages, the ferroelectric layer is heated towards the second temperature T$_H$. The flow of cold and hot fluids are supplied from a heat sink 644 and a heat source 642, respectively, through, for example, a conduit 640.

The heat exchangers 632 and 634 are adapted for alternately delivering the flow of cold fluid and the hot fluid so as to alternately cool the ferroelectric layer 610 at a first temperature T$_L$, and heat the ferroelectric layer 610 at a second temperature T$_H$. The plurality of control valves 660 is adapted for controlling the flow of cold and hot fluids in order to cycle the ferroelectric modules around their respective transition temperatures. The plurality of control valves 660, controlled by microcontrollers, are connected to thermocouples in the heating and cooling fluids and attached to the ferroelectric, and the temperature and other data such as the capacitance of the ferroelectric may be used to control the opening and closing of the control valves 660. The pressure in the hot and cold fluids may also be monitored at one or more locations, respectively. The cooling and heating of the ferroelectric is coordinated with the opening and closing of the electrical circuit, all under the direction of a control circuit that is subject to computer control, to achieve the cycle described herein. Electrical and thermal cycling are coordinated by directly monitoring, among other things, the temperature of the ferroelectric with devices such as thermocouples or thyristors; the temperature of the heating and cooling fluids; the capacitance of the ferroelectric system, capacitance being correlated to the temperature of the ferroelectric layer as a whole; the polarization of the ferroelectric layer; and/or the pressure of the hot and cold fluids, particularly in two-phase heat exchanger configurations. The extent of unbound charges on the electrodes 622 and 624 may also be monitored and may be used in controlling the cycle.

Figure 6:
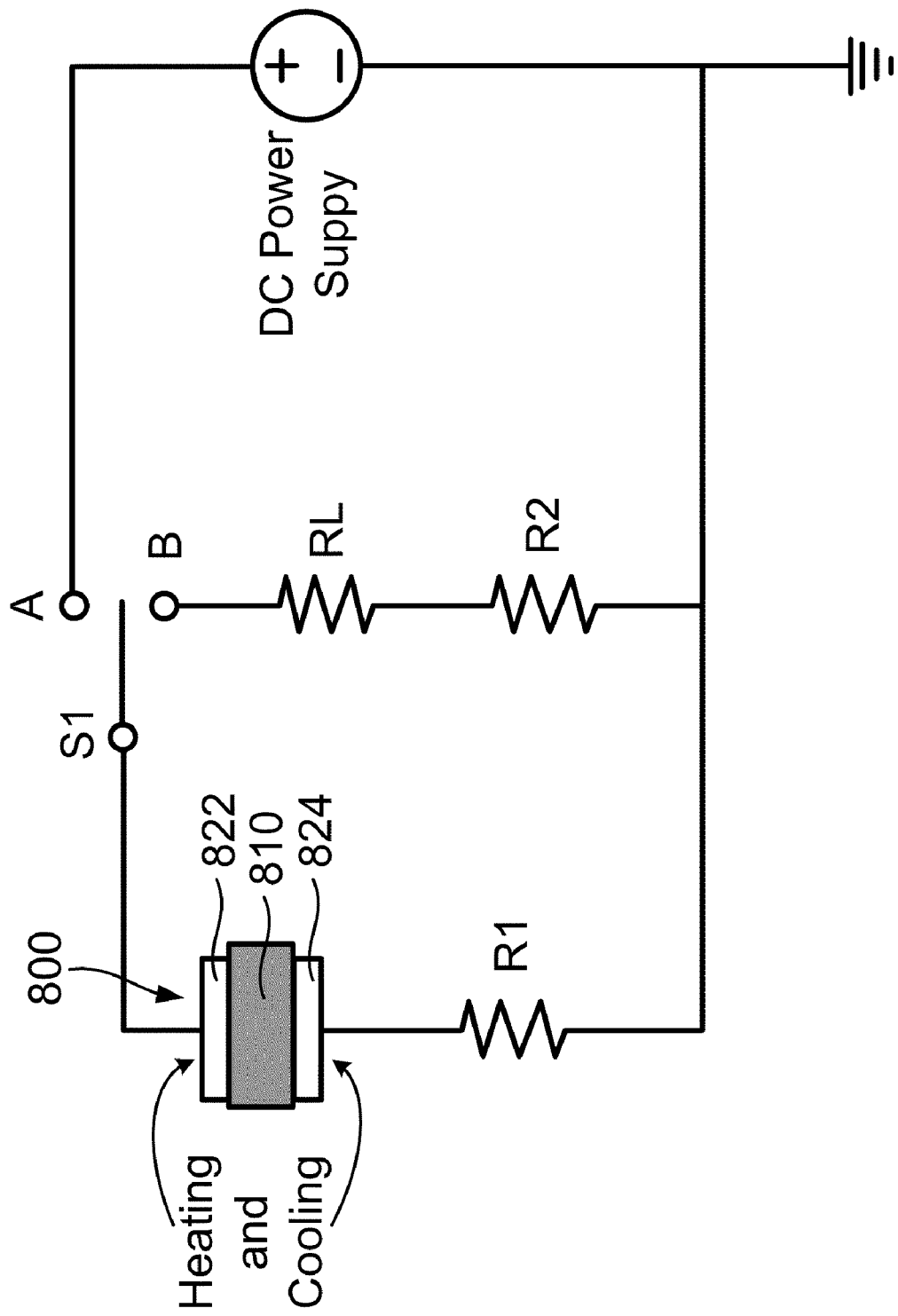
FIG. 6 shows schematically a ferroelectric power generator for operation with a resistive load according to one embodiment of the present invention.

FIG. 6 illustrates schematically a heat-to-electric energy conversion device 800 connected to a DC power supply for poling, and to an external load resistance, RL, for receiving the electrical power generated, according to one embodiment of the present invention. According to one embodiment, one or more monitoring devices (not shown) are attached to or embedded in the ferroelectric device to monitor the temperature of the ferroelectric material. Such monitoring may be done, for example, by one or more thermocouples or thyristors or by monitoring the capacitance of the device. Additionally, resistors R1 and R2 which may remain in the circuit to monitor the current, as they have negligible resistance compared to the load resistance RL. Polarization may be monitored by integrating the current flow through resistors R1 and/or R2. Throughout the cycle, the ferroelectric module 800 undergoes actions controlled by one or more computers acting through a control circuit, which are not shown, that control heating and cooling and control the switch S1.

In practice, the cycling of the ferroelectric modules 600 and 800 are repetitive and ongoing so long as the device is to be used to generate electricity from heat. Thus, a description of the cycle could begin at any point in the cycle. For the purpose of illustrating the operation of the device in one embodiment, the ferroelectric module 600 or 800 is initially assumed to be at point C of the cycle depicted in FIG. 22. At that point, switch S1 is opened and the ferroelectric layer 810 is at T$_H$ and polarization is at P$_L$. While the switch S1 remains open, the ferroelectric layer 810 is cooled to T$_L$ by the withdrawal of heat, bringing the cycle to point D in FIG. 22.

Keeping the switch S1 open prevents the flow of charge to or from the electrodes 822 and 824. Polarization remains at $P_L$ during that step of the cycle.

At point D of the cycle, switch S1 is switched to position A as shown on FIG. 6, which closes the circuit between the electrodes 822 and 824 and the DC voltage source. While the switch S1 is in position A, heat is withdrawn from the ferroelectric layer 810 isothermally, corresponding to step DA of the cycle depicted in FIG. 22. Poling caused by the minimal field from the DC voltage source aligns the electric dipoles to the extent permitted by the structure of the material system, thereby giving rise to dense bound charges on the surfaces of the ferroelectric layer 810. Those bound charges cause screening charges to develop on electrodes 822 and 824 that are equal and opposite to the bound charges at the surfaces of the ferroelectric layer 810. Heat $Q_L$ withdrawn during the DA step of the cycle corresponds to the enthalpy of phase transition. At point A, spontaneous polarization in the ferroelectric layer 810 is at the maximum, $P_H$, and the net electric field in the electrodes is negligible since the electrodes now carry sufficient charges to balance the bound charges due to $P_H$. Large amounts of electrical energy are generated spontaneously during step DA corresponding to the free energy difference between points D and A in FIG. 21. FIG. 3 illustrates (1) the bound charges in the ferroelectric that are the result of the aligned electric dipoles and $P_s$ and (2) the screening charges that arise on the electrodes in opposition to those bound charges, as would occur at point A of the cycle (though at point A the load resistance RL would not be in the circuit as it is depicted in FIG. 3).

The voltage required for poling is small compared to the voltage at which the charge is discharged from the ferroelectric device 800, and the net electrical work output during step BC is thus much greater than the electrical work input during poling. Other than the minimum required for poling in such instances, a voltage need not be applied across the ferroelectric layer 810 and is discontinued. When polarization reaches $P_H$, the switch S1 is opened (represented schematically as the mid-position in FIG. 6), and the device is at point A in the cycle of FIG. 22. The field that is sufficient for poling depends upon the particular material, its geometry, whether the device is operated in a single- or multi-stage configuration, and other factors. By way of an example, for some single stage, lead-based ceramic ferroelectrics of approximately 1.0 mm thickness, an adequate poling field may be achieved by a voltage of approximately 200 volts. By contrast, the generated voltage can exceed 6,000 volts during electrical power output. Without poling, the unit cells would spontaneously exhibit electric dipoles when the material is in the ferroelectric phase but, in the overall aggregate, the dipoles would not be aligned. Such alignment is essential to achieve the high overall $P_s$ values that are exploited by the invention.

During the AB step of the cycle depicted in FIG. 22, the switch S1 is open, and the ferroelectric layer 810 is heated to $T_H$ so that it transitions out of the ferroelectric phase. Because the switch is open, the unbound charges on the electrodes are prevented from discharging during the lattice heating that occurs during the AB step, which in turn causes total polarization to remain at $P_H$.

At point B of the cycle, switch S1 is switched to position B and heat is added to the ferroelectric layer 810 isothermally at $T_H$ so that large amounts of electrical energy are released to the load RL from the ferroelectric module 800. As the electrical charges are removed from the electrodes 822 and 824, the charges are received at a very high voltage by the load resistor, RL, or by any other suitable device that can be used to store, transmit, or utilize electricity for work. When the free charges remaining on the electrodes 822 and 824 have diminished such that $P_L$ is zero or negligible, the withdrawal of electrical energy from the electrodes is completed and switch S1 is opened, which corresponds to point C of the cycle. Total polarization at that point is $P_L$, and the ferroelectric layer 810 is at $T_H$.

Figure 24:
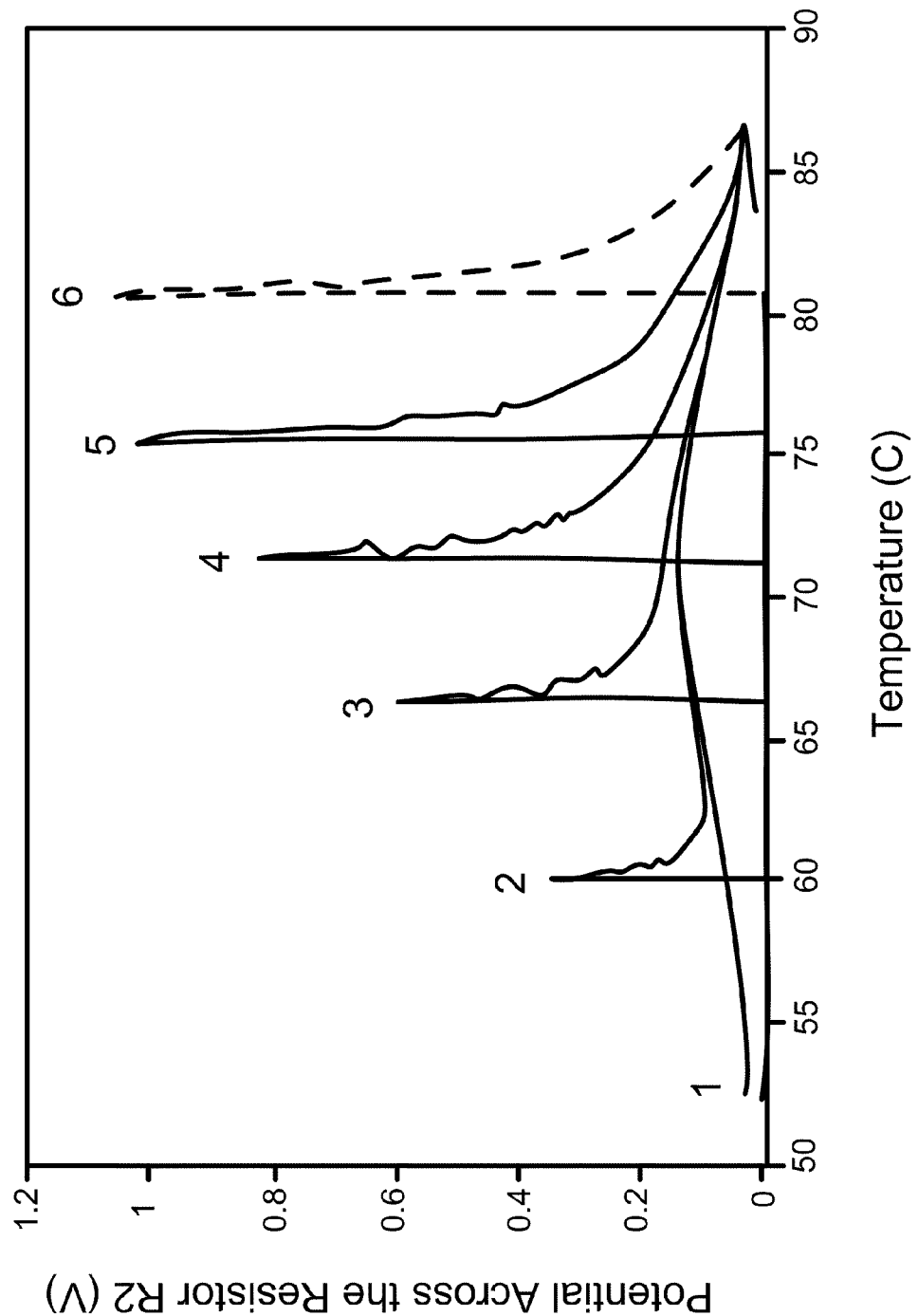
FIG. 24 shows the measured electric current generation during the heating phases, resulting from changes in the permanent polarization that correspond to different relay turn-on temperatures for a P(VDF-TrFE) copolymer film of 50 μm thickness.

FIG. 24 shows the measured electric current generated during the heating phases resulting from the change in permanent polarization that correspond to different relay turn-on temperatures for a P(VDF-TrFE) copolymer film of 50 μm thickness. The load resistor RL had a resistance of 10 MΩ, and the measure resistors R1 and R2 were chosen at 0 and 22 kΩ, respectively. The horizontal axis has been largely expanded due to the somewhat broad transition of the copolymer, which makes the original peak (line 1) look flat. Lines 2-6 in FIG. 24 show the electricity generated with increasing delay temperature (time). These lines correspond to the AB step in the thermodynamic cycle shown in FIG. 22. The electric potential (field) generated across the sample dramatically increases with larger delay temperatures, reaching about 10 times the potential attained with the original peak of line 1. The increasing potential with larger delay temperature corresponds to the enlargement of the rectangular cycle along the temperature axis at constant polarization (AB step). Thermodynamically, this leads to a larger efficiency. The integrated intensities remain largely constant, as expected.

The thermal cycling and the electrical inputs and outputs are computer controlled throughout the cycle. Heating and cooling during the various steps of the cycle are accomplished by microcontrollers causing hot and cold fluids to be alternately directed to the ferroelectric module 800. Different controls, as may be appropriate to a particular application and to a particular heating and cooling system, can be attained by using microcontrollers in combination with computers and a control circuit. The control valves that regulate the flow of heating and cooling fluids to the ferroelectrics in one embodiment are illustrated in FIGS. 4 and 5. The computer controls receive temperature values from thermocouples or other devices that monitor the temperature in the heating and cooling fluids and in the ferroelectric materials. Pressures in the hot and cold fluid fluids may also be monitored. The computer controls also monitor polarization and load currents as measured, for example, by resistors R1 and R2 as shown in FIG. 6. Polarization may be monitored by integrating the current flow through resistors R1 and/or R2. Computers and a control circuit control the heat exchangers to cause appropriate thermal cycling of the ferroelectric module. Microcontrollers that receive such monitoring data under computer control also direct the position of the switch S1. Instead of or in addition to thermocouples or thyristors, capacitance or other measurements of one or more control ferroelectrics may be used as monitors and to control the timing of the cycling and switching with the control circuit.

The thermal cycling and the electrical inputs and outputs are computer controlled throughout the cycle. Heating and cooling during the various steps of the cycle are accomplished by microcontrollers causing hot and cold fluids to be alternately directed to the ferroelectric module 800. Different controls, as may be appropriate to a particular application and to a particular heating and cooling system, can be obtained by using microcontrollers in combination with computers and a control circuit. The control valves that regulate the flow of heating and cooling fluids to the ferroelectrics in one embodiment are illustrated in FIGS. 4 and 5. The computer controls receive temperature values from thermocouples or other devices that monitor the temperature in the heating and cooling fluids and in the ferroelectric materials. Pressures in the hot and cold fluid fluids may also be monitored. The computer controls also monitor polarization and load currents as measured, for example, by resistors R1 and R2 as shown in FIG. 6. Polarization may be monitored by integrating the current flow through resistors R1 and/or R2. Computers and a control circuit control the heat exchangers to cause appropriate thermal cycling of the ferroelectric module. Microcontrollers that receive such monitoring data under computer control also direct the position of the switch S1. Instead of or in addition to thermocouples or thyristors, capacitance or other measurements of one or more control ferroelectrics may be used as monitors and to control the timing of the cycling and switching with the control circuit.

Referring to FIG. 7, a method 900 for operating the invented device for converting heat to electrical energy is shown according to one embodiment of the present invention. In one embodiment, the method 900 includes the following steps: at step 910, a ferroelectric layer is provided. The ferroelectric layer is comprised of a ferroelectric material characterized with a Curie temperature, $T_c$. A pair of electrodes is positioned respectively on the first surface and the second surface of the ferroelectric layer, with electrical leads going from the electrodes to external circuitry. The electrodes are comprised of a thermally and electrically conductive material.

At step 920, a cold fluid and a hot fluid are alternately delivered so as to alternately cool the ferroelectric layer to a first temperature $T_L$ that is lower than the Curie temperature $T_c$, and heat the ferroelectric layer to a second temperature $T_H$ that is higher than the Curie temperature $T_c$. During step 920, the electrical circuit is opened so that cooling and heating occur under effectively constant polarization while lattice cooling and heating occur. The cold fluid and the hot fluid can alternately be delivered by heat exchangers, control valves, or the likes, controlled in coordination with data monitors and under direction from a control circuit.

At step 930, a cold fluid and a hot fluid are alternately delivered so as to alternately remove heat from the ferroelectric layer isothermally at a first temperature $T_L$ that is lower than the Curie temperature $T_c$, and add heat to the ferroelectric layer isothermally at a second temperature $T_H$ that is higher than the Curie temperature $T_c$. During step 930, the electrical circuit is closed so that the removal of heat occurs as polarization changes from $P_L$ to $P_H$, and the addition of heat occurs as polarization changes from $P_H$ to $P_L$. A cold fluid and a hot fluid can alternately be delivered by heat exchangers, control valves, or the likes, controlled in coordination with data monitors and under direction from a control circuit.

At step 940, with the ferroelectric material initially in a metastable state, the spontaneous polarization of the domains in the ferroelectric material is poled at temperature $T_L$ so as to generate electrically-opposite screening charges on the pair of electrodes. In one embodiment, poling is performed by applying a small DC voltage to the ferroelectric layer to create a poling field that aligns the dipoles.

At step 950, when heat is added to the ferroelectric material of the ferroelectric layer isothermally at $T_H$ and the circuit is closed, electricity corresponding to the generated electrically-opposite screening charges on the pair of electrodes is output to external circuitry at a very high voltage.

It should be noted that, while the essential function of the device occurs in a single layer with a given ferroelectric material, the invention generally may be more useful in practical applications and may produce greater quantities of electrical energy from a particular heat source where a number of ferroelectric materials are combined in a series of stages. In some applications where the temperature difference between the heat source and the heat sink is small, a single layer may be appropriate. While that situation allows a less robust opportunity for converting heat to electricity, that is an unavoidable consequence of thermodynamics, which dictates that the maximum efficiency of any system that converts thermal energy to another form of energy or work is the Carnot efficiency, $\eta_c = \Delta T/T_H$. In applications where $\Delta T$ is larger, it may be desirable to utilize a multistage conversion module that includes a series of ferroelectric materials with a succession of phase transition temperatures that correspond to the available temperatures between $T_H$ and $T_L$. The magnitude of $\Delta T$ that warrants multi-stage treatment will vary depending upon the specific application and materials system used. There may be applications where it is appropriate to operate a single device over a relatively large $\Delta T$, for example 100° C. or more, and that may be the case in particular in conjunction with heat regeneration techniques.

There are a number of configurations or embodiments whereby the basic principle of the present invention can be used in a multistage format with multiple ferroelectrics that have multiple phase transition temperatures, several of which embodiments will be described here. By providing these descriptions, it is not the intention to limit the invention to these configurations, which are merely illustrative. Also, where these descriptions and embodiments refer to Curie temperatures, $T_c$, it should be understood that the descriptions are equally applicable for ferroelectrics where the ferroelectric phase exists at temperatures above the transition temperature and the material is paraelectric below that transition temperature; for ferroelectrics where the transition is between ferroelectric and antiferroelectric phases; and for polarizable polymers.

FIG. 8 shows an apparatus 1000 having a plurality of ferroelectric modules, FM1, FM2, . . . FMn-1 and FMn, arranged in an array to expand the working surface that interfaces with the heat exchangers so as to increase the amount of thermal energy that can be received from the heat source and be converted to electrical energy. The electrical output is removed by buses 1001 connected to the electrodes of each module.

Figure 9:
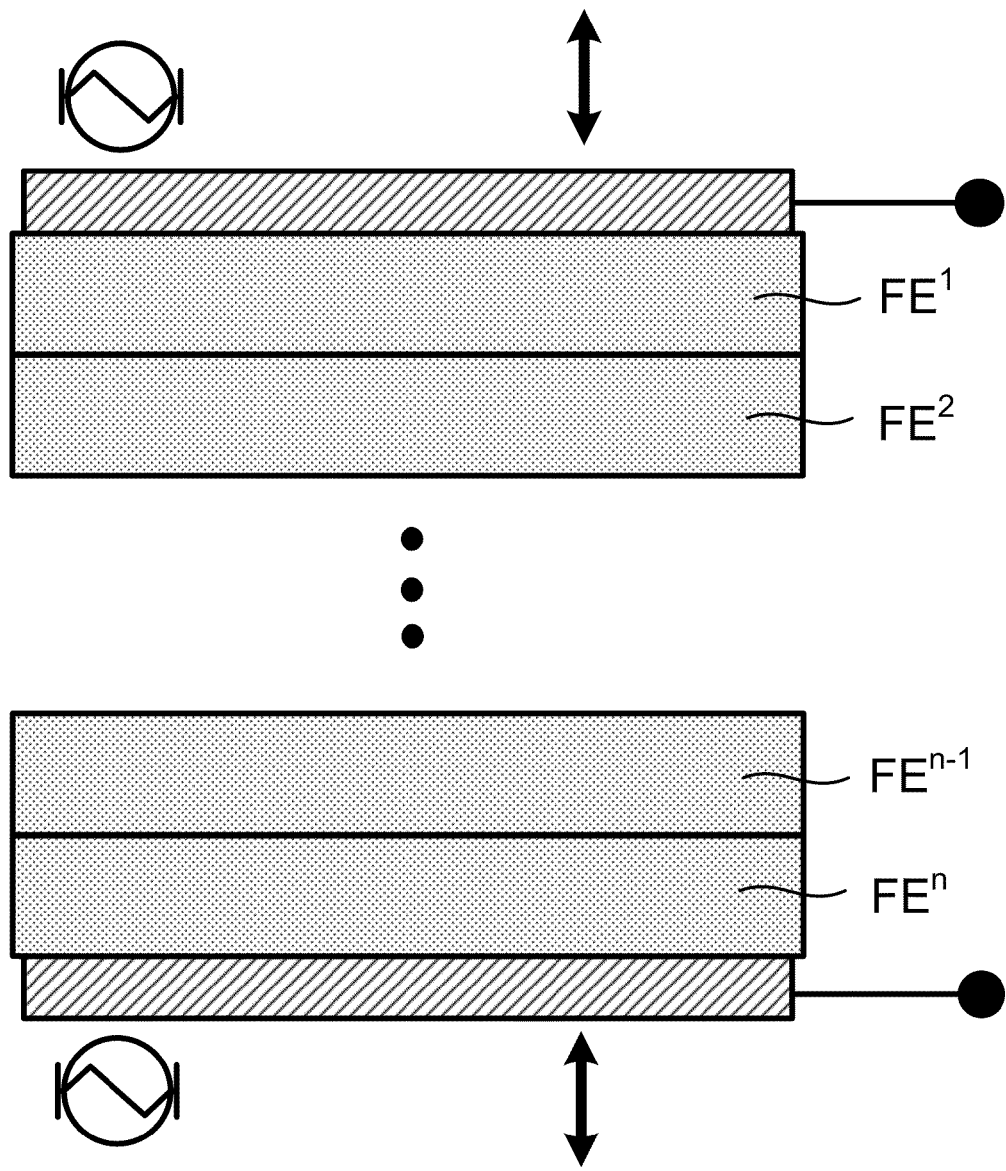
FIG. 9 shows schematically a ferroelectric device for converting heat to electric energy according to another embodiment of the present invention.
Figure 10:
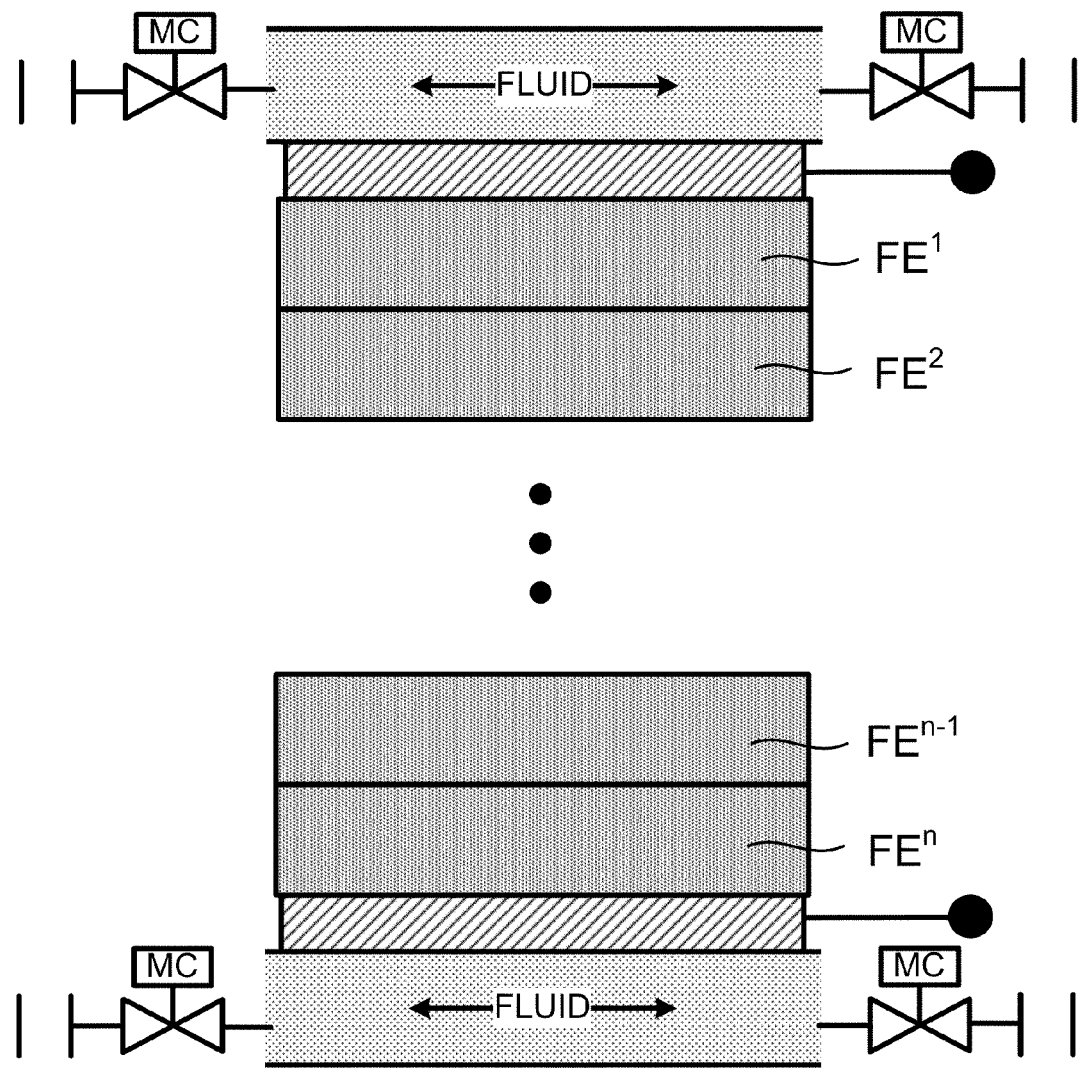
FIG. 10 shows schematically a ferroelectric device for converting heat to electric energy according to yet another embodiment of the present invention.

In a multilayer configuration, a series of ferroelectric layers may be arranged in a stack formed in order to maximize thermal conductivity. The resulting multilayered ferroelectric structure is placed between a pair of electrodes, which is similar to the single layer device as disclosed above. Such a configuration is illustrated diagrammatically by FIGS. 9 and 10. The sequential layers, $FE^1$, $FE^2$ . . . $FE^{n-1}$ and $FE^n$, are formed of an identical ferroelectric material or substantially different ferroelectric materials. The Curie temperatures, $T_c^1$, $T_c^2$ . . . $T_c^{n-1}$ and $T_c^n$, correspond to the ferroelectric materials in the sequential layers $FE^1$, $FE^2$ . . . $FE^{n-1}$ and $FE^n$. In one embodiment, the multilayered ferroelectric materials are arrayed so that $T_c^{i+1} > T_c^i$. In one embodiment, the combined multilayer module is then cycled thermally and electrically so that each individual layer cycles around its phase transition temperature in a cycle that has two isothermal steps and two steps where total polarization in the layer is maintained constant. Each layer, during the course of a cycle, undergoes ferroelectric-paraelectric or ferroelectric-antiferroelectric cycling with poling and discharge as described herein for a single layer device. With this multilayer configuration, as shown in FIGS. 9 and 10, the electrical energy removed at high voltage during the discharge step of the cycle is related to the total spontaneous polarization, $P_s$, at the junctures of the electrodes and the ferroelectric materials designated as $FE^1$ and $FE^n$, which polarization results from the cumulative spontaneous polarization of each FE layer acting together.

Figure 11:
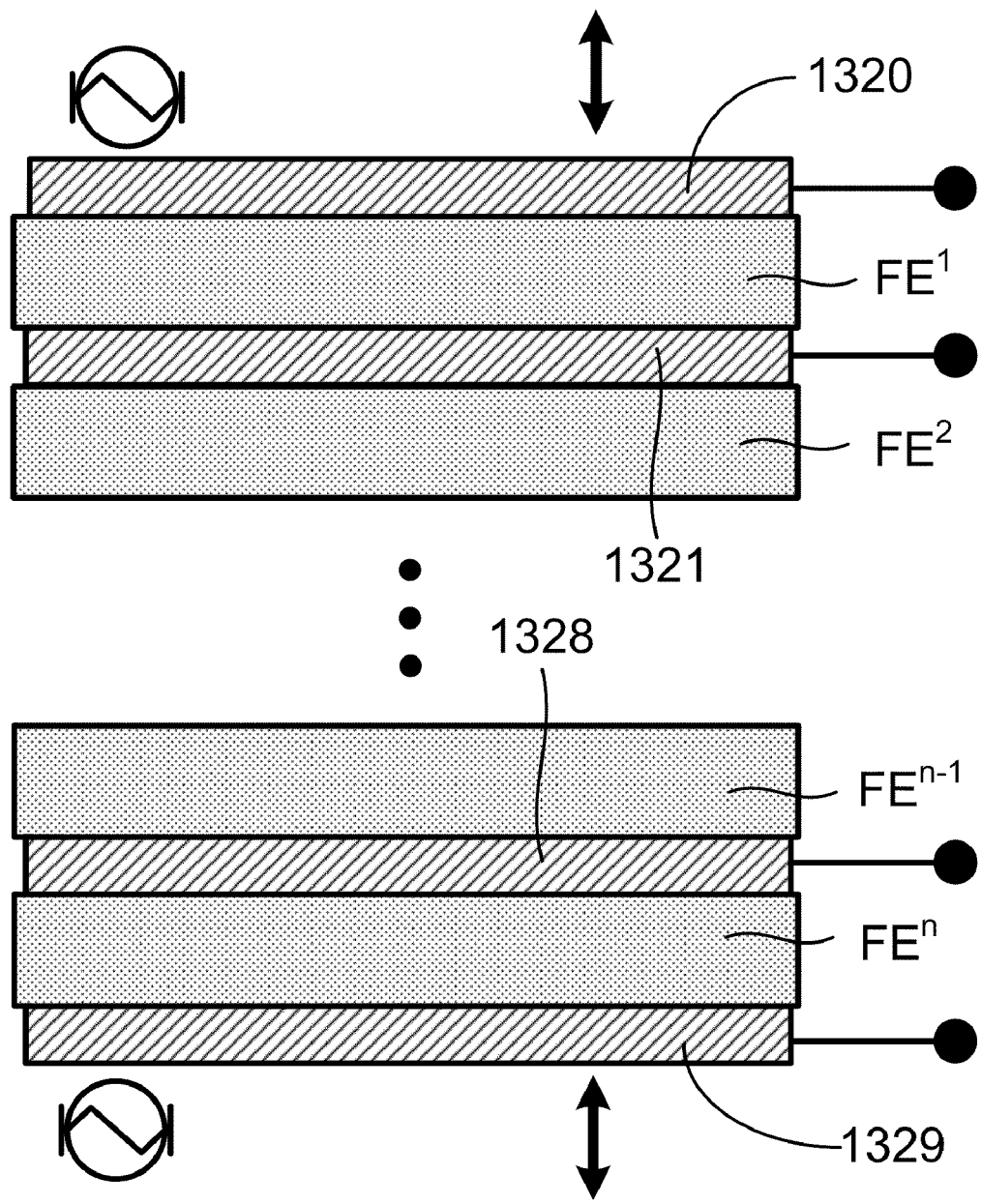
FIG. 11 shows schematically a ferroelectric device for converting heat to electric energy according to an alternative embodiment of the present invention

Referring to FIG. 11, another embodiment of a multilayered ferroelectric device 1300 is shown according to the present invention. This configuration of the multilayered ferroelectric device 1300 is similar to the device as disclosed in FIG. 9, but separate electrodes are placed between each ferroelectric layer. For example, the ferroelectric layers $FE^1$ and $FE^2$ are separated by the electrode 1321, while the ferroelectric layers $FE^{n-1}$ and $FE^n$ are separated by the electrode 1328. These electrodes 1320, 1321 ... 1328 and 1329 are formed of a thermally and electrically conductive material. The thermal and electrical cycling and operation of the device 1300 are similar to the device as disclosed in FIGS. 9 and 10. However, the extraction of the electrical energy from the device is different. In this configuration, the electrical energy is withdrawn during the discharge step of the cycle from all of the electrodes 1320, 1321 ... 1328 and 1329, as shown in FIG. 11. The electrical energy withdrawn from the electrodes 1320, 1321 ... 1328 and 1329 can then either be transported via the connective leads to a load resistance or to a bus for exportation to such external circuitry and use as may be desired.

Figure 12:
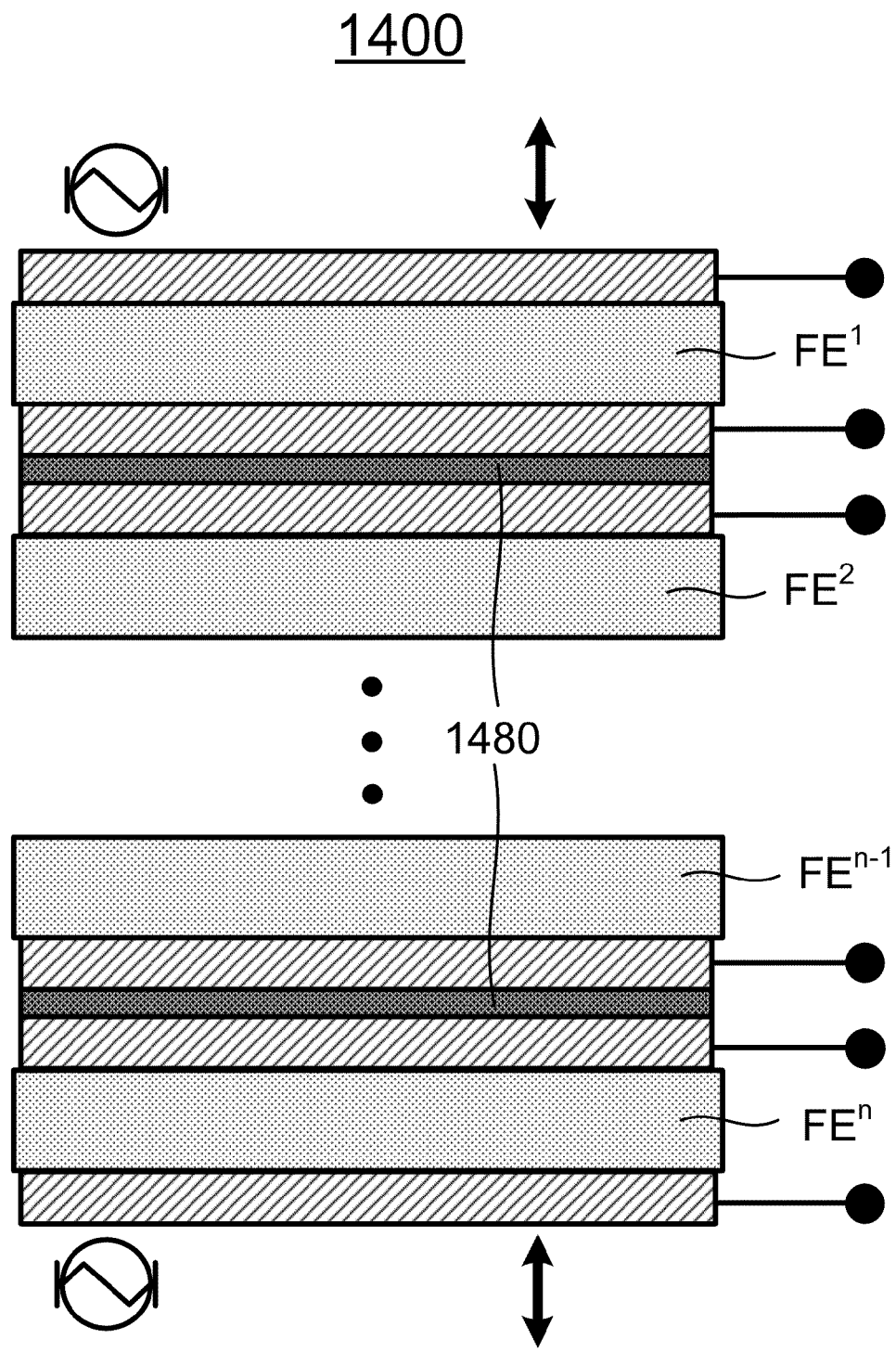
FIG. 12 shows schematically a ferroelectric device for converting heat to electric energy according to a further embodiment of the present invention.

FIG. 12 shows schematically an alternative embodiment of a multilayered ferroelectric device 1400. This configuration of the multilayered ferroelectric device 1400 is similar to the device as disclosed in FIG. 11, but each ferroelectric layer is separated from the adjacent layer of ferroelectric material by two electrodes which, in turn, are separated by an electrical insulator 1480, which is selected to minimally impede thermal transfer.

Figure 13:
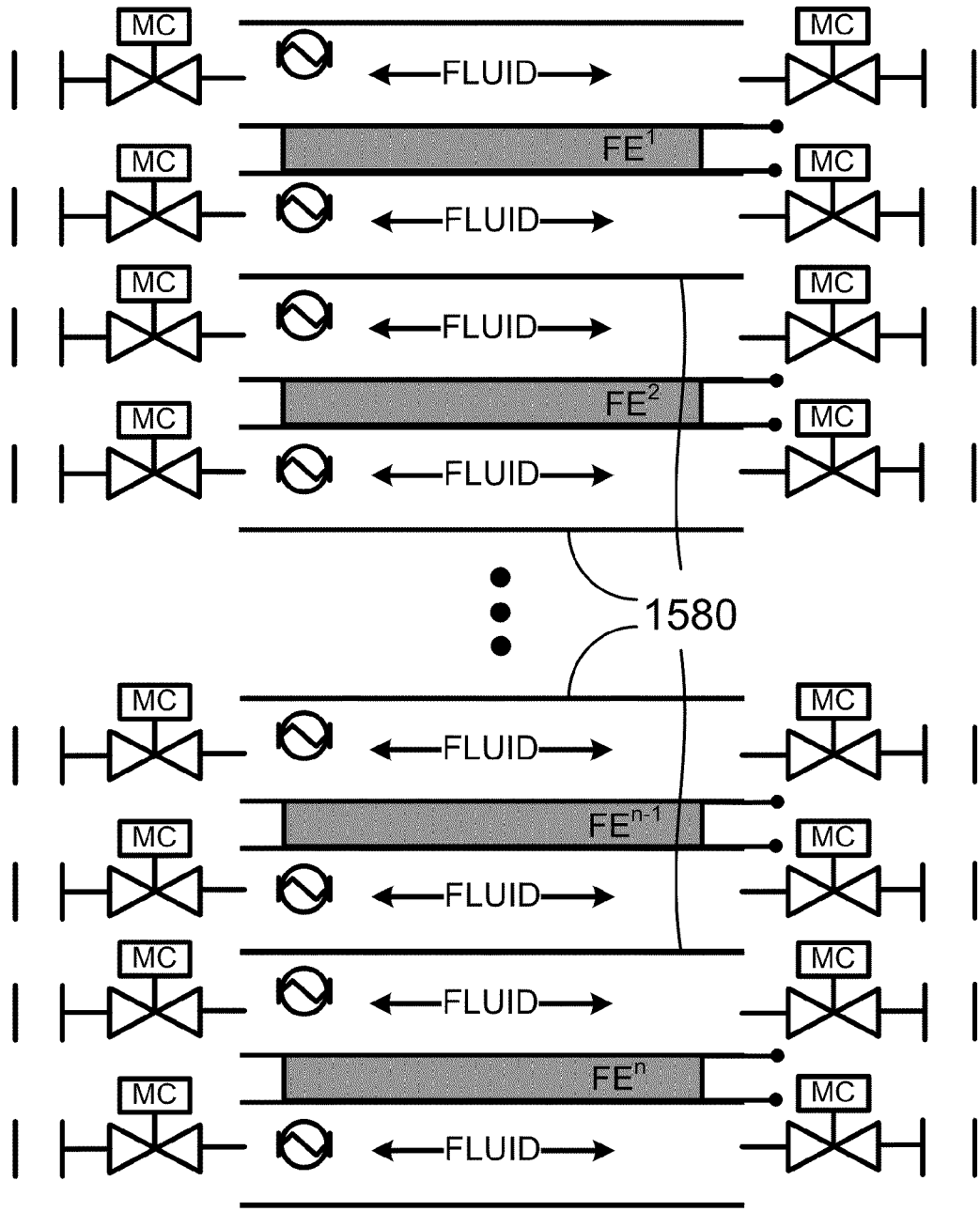
FIG. 13 shows schematically a ferroelectric device for converting heat to electric energy according to yet a further embodiment of the present invention.

FIG. 13 illustrates schematically a system of n individual ferroelectric modules with a series of different phase transition temperatures, $T_c^1$ to $T_c^n$, that lie in an increasing (or decreasing) sequence between the temperatures of the heat source, $T_H$, and the heat sink, $T_L$, and that are operated with a heat exchanger system so as to cycle each ferroelectric stage, $FE^i$, around its respective phase transition temperature, $T_c^i$. In this configuration, the phase transition temperatures vary among different ferroelectric layers $FE^1$, $FE^2$ ... $FE^{n-1}$ and $FE^n$. As shown in FIG. 13, a series of single-layer devices as shown in FIG. 4 are arranged in a stack. Each single-layer device operates with heat exchangers that selectively heat and cool the individual ferroelectric modules so that the i-th layer is thermally cycled around its respective phase transition temperature, $T_c^i$. In this configuration, the ferroelectric modules are integrated with a networked heat exchanger that cycles each ferroelectric module, $FM^i$, around its transition temperature, $T_c^i$. The heat exchangers may be interconnected to facilitate regenerative heating and cooling or to facilitate operating the ferroelectric modules in cascade with decreasing temperature. Adjacent heat exchangers may be thermally insulated from one another by thermal insulators 1580, as shown in FIG. 13. In this system, thermocouples are located such that the temperature of the heating and cooling fluids is monitored throughout the system, as are the temperatures or capacitance of the ferroelectrics in the individual modules. A system of microcontrollers acting in a control circuit then directs the heating and cooling fluids at appropriate temperatures to cause each ferroelectric stage, $FE^i$, to cycle around its respective phase transition temperature, $T_c^i$, in the format and method of poling and thermal and electrical cycling described herein for a single-stage device. In one embodiment, each cycle of the various ferroelectric stages, $FE^i$, undergoes coordinated thermal and electrical cycling as described herein for a single stage with two isothermal steps and two steps where total polarization in the layer is maintained constant. The electrical energy withdrawn from the electrodes can either be transported via the connective leads to a load resistance or to a bus for exportation to such external circuitry and use as may be desired.

In sum, the present invention, among other things, discloses apparatuses and methods for converting heat to electricity by using one or more ferroelectric or other polarizable materials that exhibit changes in spontaneous polarization with temperature change. The ferroelectric or other polarizable material is cycled between temperatures above and below the phase transition temperature to utilize the change in spontaneous polarization. The cycle has four steps, two of which are isothermal and two of which occur at constant polarization. During one step of the cycle, a small poling field is first applied isothermally so that the resulting dipoles are aligned in one orientation—i.e., they become poled. During another step of the cycle, heat is input isothermally while polarization is reduced so that the charges on the electrode are discharged into external circuitry at high voltage. By controlling the cycling of the ferroelectric in this fashion, the amount of electrical energy discharged during each cycle is enhanced in comparison to other cycling formats. While the device may be used with a single such ferroelectric material, more robust conversion of heat to electricity may be achieved in some applications by using a series of ferroelectrics that have a succession of phase transition temperatures that vary across the range of temperatures between the temperatures of the heat source and heat sink for the application. Electrocaloric cooling may be achieved by reversing the process.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An apparatus for converting heat to electric energy, comprising:
   (a) a first electrode formed of a thermally and electrically conductive material;
   (b) a second electrode formed of a thermally and electrically conductive material, wherein the second electrode is spaced from the first electrode;
   (c) one or more layers of electrically polarizable material between the first and second electrodes;
   (d) one or more heat exchangers for removing thermal energy from or adding thermal energy to the one or more layers of electrically polarizable material;
   (e) a DC voltage source for applying a DC poling voltage to the one or more layers of electrically polarizable material;
   (f) a control circuit, the control circuit:
   (i) withdrawing thermal energy from the one or more layers of electrically polarizable material to cool the one or more layers of electrically polarizable material to a temperature $T_L$ using the one or more heat exchangers, wherein current does not flow between the first and second electrodes during cooling;

(ii) subsequently applying the DC poling voltage to the one or more layers of electrically polarizable material;

(iii) withdrawing thermal energy from the one or more layers of electrically polarizable material using the one or more heat exchangers while the DC poling voltage is applied to the one or more layers of electrically polarizable material and current is allowed to flow between the first and second electrodes such that the electrically polarizable material develops an overall net spontaneous polarization and screening charges are generated on the first and second electrodes;

(iv) removing the DC poling voltage from the one or more layers of electrically polarizable material;

(v) subsequently adding thermal energy to the one or more layers of electrically polarizable material to heat the electrically polarizable material to a temperature $T_H$ using the one or more heat exchangers while not allowing current to flow between the electrodes, wherein the DC poling voltage is not applied to the one or more layers of electrically polarizable material while thermal energy is added to the electrically polarizable material;

(vi) subsequently connecting the first and second electrodes across a load; and (vii) subsequently adding thermal energy to the one or more layers of electrically polarizable material while the electrodes are connected across the load such that electrical energy corresponding to the generated screening charges on the pair of electrodes is output to the load;

wherein the electrically polarizable material exhibits spontaneous polarization at $T_L$ and wherein the spontaneous polarization exhibited by the electrically polarizable material at $T_H$ is less than the spontaneous polarization exhibited by the electrically polarizable material at $T_L$.

2. The apparatus of claim 1, wherein each of the one or more layers of electrically polarizable material has a phase transition temperature at which the material transitions between a phase in which the material exhibits spontaneous polarization and a phase in which the material does not exhibit spontaneous polarization.

3. The apparatus of claim 2, wherein the electrically polarizable material is in the phase which exhibits spontaneous polarization at the temperature $T_L$ and $T_H$.

4. The apparatus of claim 2, wherein the electrically polarizable material is in the phase which exhibits spontaneous polarization at the temperature $T_L$ and wherein the electrically polarizable material is in the phase which does not exhibit spontaneous polarization at the temperature $T_H$.

5. The apparatus of claim 1, wherein the electrically polarizable material is an electrically polarizable amorphous polymer material.

6. The apparatus of claim 1, the controller removing the DC poling voltage from the electrically polarizable material (iv) while withdrawing thermal energy from the electrically polarizable material (iii) and before subsequently adding thermal energy to the electrically polarizable material (v).

7. The apparatus of claim 6, wherein a local free energy maximum occurs while withdrawing thermal energy from the electrically polarizable material (iii) and wherein the DC poling voltage is removed from the electrically polarizable material (iv) after passing the local free energy maximum.

8. The apparatus of claim 6, the controller connecting the first and second electrodes across the load while withdrawing thermal energy from the electrically polarizable material (iii) after removing the DC poling voltage (iv) and before subsequently adding thermal energy is to the electrically polarizable material (v).

9. The apparatus of claim 8, wherein the control circuit further comprises a full wave rectifier such that current flows to and from the first and second electrodes in the same direction at the load:

when the first and second electrodes are connected across the load while thermal energy is withdrawn from the electrically polarizable material (iii); and when the first and second electrodes are connected across the load while thermal energy is added to the electrically polarizable material (vii).

10. The apparatus of claim 1, wherein each of the one or more layers of electrically polarizable material comprises a ferroelectric material having a Curie temperature, $T_c$, such that when the temperature of the ferroelectric material is lower than the Curie temperature, $T_c$, the ferroelectric material is in a ferroelectric phase and when the temperature of the ferroelectric material is greater than the Curie temperature, $T_c$, the ferroelectric material is in a paraelectric or anti-ferroelectric phase.

11. The apparatus of claim 1, wherein each of the one or more heat exchangers comprises a device for delivering a flow of fluids to the one or more layers of electrically polarizable material or to a material in direct or indirect contact with the one or more layers of electrically polarizable material such that thermal energy is exchanged between the fluids and the one or more layers of electrically polarizable material.

12. The apparatus of claim 11, further comprising a temperature measuring device for monitoring the temperature of the fluids and/or a pressure measuring device for monitoring the pressure of the fluids.

13. The apparatus of claim 1, wherein one or more fluid passages are formed in, on or adjacent to each of the first and second electrodes and wherein the one or more heat exchangers deliver a fluid into the fluid passages such that thermal energy is exchanged between the fluid and the one or more layers of electrically polarizable material.

14. The apparatus of claim 11, further comprising a plurality of control valves for controlling the flow of the fluids.

15. The apparatus of claim 14, further comprising one or more microcontrollers, wherein the plurality of control valves are controlled by one or more microcontrollers.

16. The apparatus of claim 1, further comprising:

a temperature measuring device for monitoring the temperature of the one or more layers of electrically polarizable material;

a capacitance measuring device for monitoring the capacitance of the one or more layers of electrically polarizable material;

a polarization measuring device for monitoring the polarization of the one or more layers of electrically polarizable material; and/or a current measuring device for monitoring the current to and/or from the electrodes.

17. The apparatus of claim 1, comprising a plurality of layers of electrically polarizable material arranged in a stack between the first and second electrodes.

18. The apparatus of claim 17, wherein each of the layers of electrically polarizable material comprises the same electrically polarizable material.

19. The apparatus of claim 17, wherein the plurality of layers of electrically polarizable material comprises at least two different electrically polarizable materials each having a transition temperature between $T_L$ and $T_H$.

20. The apparatus of claim 17, wherein at least two adjacent layers of electrically polarizable material in the stack are separated by an electrode formed of a thermally and electrically conductive material.

21. The apparatus of claim 17, wherein at least two adjacent layers of electrically polarizable material are separated by two electrodes each formed of a thermally and electrically conductive material and wherein the two electrodes are separated by an electrical insulator.

22. The apparatus of claim 1, wherein the control circuit comprises a switch having an open position and first and second closed positions, wherein the switch is connected between the first and second electrodes and wherein:
when the switch is in the open position, current does not flow between the first and second electrodes;
when the switch is in the first closed position, the DC voltage source is connected across the first and second electrodes; and
when the switch is in the second closed position, the load is connected across the first and second electrodes.

23. The apparatus of claim 22, wherein the control circuit further comprises a first resistor and a second resistor, wherein:
the first resistor is in series with the DC voltage source when the switch is in the first closed position; and
wherein the first resistor and the second resistor are in series with the load when the switch is in the second closed position.

24. The apparatus of claim 22, wherein the control circuit further comprises an electrical storage device and wherein the electrical storage device is connected across the first and second electrodes when the switch is in the second closed position.

25. A method for converting heat to electric energy, comprising:
(a) withdrawing thermal energy from an electrically polarizable material to cool the electrically polarizable material to a temperature $T_L$, wherein the electrically polarizable material is positioned between first and second electrodes each formed of a thermally and electrically conductive material and wherein current does not flow between the first and second electrodes while withdrawing thermal energy;
(b) subsequently poling the electrically polarizable material by applying a DC poling voltage to the electrically polarizable material;
(c) withdrawing thermal energy from the electrically polarizable material while the DC poling voltage is applied to the electrically polarizable material and current is allowed to flow between the first and second electrodes such that the electrically polarizable material develops an overall net spontaneous polarization and screening charges are generated on the first and second electrodes;
(d) removing the DC poling voltage from the electrically polarizable material;
(e) subsequently adding thermal energy to the electrically polarizable material to heat the electrically polarizable material to a temperature $T_H$ while not allowing current to flow between the first and second electrodes, wherein the DC poling voltage is not applied to the electrically polarizable material while thermal energy is added to the electrically polarizable material;
(f) subsequently connecting the first and second electrodes across a load; and
(g) adding thermal energy to the electrically polarizable material while the first and second electrodes are connected across the load such that electrical energy corresponding to the generated screening charges on the pair of electrodes is output to the load;
wherein the electrically polarizable material exhibits spontaneous polarization at $T_L$ and wherein the spontaneous polarization exhibited by the electrically polarizable material at $T_H$ is lower than the spontaneous polarization exhibited by the electrically polarizable material at $T_L$.

26. The method of claim 25, wherein the electrically polarizable material has a phase transition temperature at which the material transitions between a phase in which the material exhibits spontaneous polarization and a phase in which the material does not exhibit spontaneous polarization.

27. The method of claim 26, wherein the electrically polarizable material is in the phase in which the material exhibits spontaneous polarization at the temperature $T_L$ and $T_H$.

28. The method of claim 26, wherein the electrically polarizable material is in the phase in which the material exhibits spontaneous polarization at the temperature $T_L$ and wherein the electrically polarizable material is in the phase in which the material does not exhibit spontaneous polarization at the temperature $T_H$.

29. The method of claim 25, wherein the DC poling voltage is removed from the electrically polarizable material (d) while withdrawing thermal energy from the electrically polarizable material (c) such that thermal energy is withdrawn from the electrically polarizable material (c) after the DC poling voltage is removed (d) and before thermal energy is subsequently added to the electrically polarizable material (e).

30. The method of claim 29, wherein a local free energy maximum occurs while withdrawing thermal energy from the electrically polarizable material (c) and wherein the DC poling voltage is removed from the electrically polarizable material (d) after passing the local free energy maximum.

31. The method of claim 29, wherein the first and second electrodes are connected across the load while withdrawing thermal energy from the electrically polarizable material (c) after the DC poling voltage is removed (d) and before thermal energy is subsequently added to the electrically polarizable material (e).

32. The method of claim 31, wherein the control circuit further comprises a full wave rectifier such that current flows to and from the first and second electrodes in the same direction at the load:
when the first and second electrodes are connected across the load while thermal energy is withdrawn from the electrically polarizable material (c); and
when the first and second electrodes are connected across the load while thermal energy is added to the electrically polarizable material (g).

33. The method of claim 25, wherein thermal energy is added or removed from the ferroelectric material in (a), (c), (e) and (g) by convection, conduction, radiation or combinations thereof.

34. The method of claim 25, wherein the electrically polarizable material is ferroelectric material having a Curie temperature, $T_c$, such that when the temperature of the ferroelectric material is lower than the Curie temperature $T_c$, the ferroelectric material is in a ferroelectric phase and when the temperature of the ferroelectric material is greater than the Curie temperature $T_c$ the material is in a paraelectric or antiferroelectric phase.

35. The method of claim 25, wherein adding and withdrawing thermal energy comprises delivering a flow of one or more fluids to the electrically polarizable material or to a material in direct or indirect contact with the electrically polarizable material such that thermal energy is exchanged between the one or more fluids and the electrically polarizable material.

36. The method of claim 35, wherein the one or more fluids is in direct or indirect thermal contact with one or more surfaces of the ferroelectric layer.

37. The method of claim 35, wherein one or more fluid passages are formed in, on or adjacent to each of the first and second electrodes and wherein the one or more fluids is passed through the one or more fluid passages such that thermal energy is exchanged between the one or more fluids and the electrically polarizable material.

38. The method of claim 34, wherein poling comprises applying a DC voltage between the pair of electrodes to align the spontaneous electric dipoles and the unit cells and domains of the ferroelectric material, such that an overall net spontaneous polarization occurs and bound charges are generated on the surfaces of the ferroelectric material, thereby generating electrically-opposite screening charges, respectively, on the pair of electrodes.

39. The method of claim 25, wherein the voltage of the electrical energy output to the load is higher than the DC poling voltage.

40. The method of claim 25, wherein (a)-(g) are repeated a plurality of times.

41. The method of claim 25, further comprising monitoring one or more of:
the temperature of the electrically polarizable material;
the temperatures of the one or more fluids;
the pressures of the one or more fluids;
the capacitance of the electrically polarizable material;
the polarization of the electrically polarizable material; and
the current to and/or from the first and second electrodes.

42. An apparatus for converting heat to electric energy, comprising:
(a) a first electrode formed of a thermally and electrically conductive material;
(b) a second electrode formed of a thermally and electrically conductive material, wherein the second electrode is spaced from the first electrode;
(c) one or more layers of an electrically polarizable material between the first and second electrodes;
(d) one or more heat exchangers for removing thermal energy from or adding thermal energy to the one or more layers of ferroelectric material;
(e) a DC voltage source for applying a DC poling voltage to the one or more layers of ferroelectric material;
(f) a control circuit, the control circuit:
(i) adding thermal energy to the one or more layers of electrically polarizable material to heat the one or more layers of electrically polarizable material to a temperature $T_H$ using the one or more heat exchangers, wherein current does not flow between the first and second electrodes during heating;
(ii) subsequently applying the DC poling voltage to the electrically polarizable material;
(iii) adding thermal energy to the one or more layers of electrically polarizable material using the one or more heat exchangers while the DC poling voltage is applied to the one or more layers of electrically polarizable material and current is allowed to flow between the first and second electrodes such that the electrically polarizable material develops an overall net spontaneous polarization and screening charges are generated on the first and second electrodes;
(iv) removing the DC poling voltage from the one or more layers of electrically polarizable material;
(v) subsequently removing thermal energy from the one or more layers of electrically polarizable material to cool the electrically polarizable material to a temperature $T_L$ using the one or more heat exchangers while not allowing current to flow between the first and second electrodes, wherein the DC poling voltage is not applied to the electrically polarizable material while thermal energy is removed from the electrically polarizable material;
(vi) subsequently connecting the first and second electrodes across a load; and
(vii) removing thermal energy from the one or more layers of electrically polarizable material while the electrodes are connected across the load such that electrical energy corresponding to the generated screening charges on the pair of electrodes is output to the load;
wherein the electrically polarizable material exhibits spontaneous polarization at $T_H$ and wherein the spontaneous polarization exhibited by the electrically polarizable material at $T_L$ is lower than the spontaneous polarization exhibited by the electrically polarizable material at $T_H$.

43. The apparatus of claim 42, wherein the electrically polarizable material has a phase transition temperature at which the material transitions between a phase in which the material exhibits spontaneous polarization and a phase in which the material does not exhibit spontaneous polarization.

44. The apparatus of claim 43, wherein the electrically polarizable material is in the phase which exhibits spontaneous polarization at the temperature $T_L$ and $T_H$.

45. The apparatus of claim 43, wherein the electrically polarizable material is in the phase which exhibits spontaneous polarization at the temperature $T_H$ and wherein the electrically polarizable material is in the phase which does not exhibit spontaneous polarization at the temperature $T_L$.

46. The apparatus of claim 43, wherein the electrically polarizable material is a ferroelectric material having a Curie temperature, $T_c$, such that when the temperature of the ferroelectric material is higher than the Curie temperature, $T_c$, the ferroelectric material is in a ferroelectric phase and when the temperature of the ferroelectric material is lower than the Curie temperature, $T_c$, the ferroelectric material is in a paraelectric or anti-ferroelectric phase.

47. A method for converting heat to electric energy, comprising:
(a) adding thermal energy to an electrically polarizable to heat the electrically polarizable material to a temperature $T_H$, wherein the electrically polarizable material is positioned between first and second electrodes each formed of a thermally and electrically conductive material and wherein current does not flow between the first and second electrodes during cooling;
(b) subsequently poling the electrically polarizable material by applying a DC voltage to the electrically polarizable material;
(c) adding thermal energy to the electrically polarizable material while the DC poling voltage is applied to the electrically polarizable material and current is allowed to flow between the first and second electrodes such that the electrically polarizable material develops an overall net spontaneous polarization and screening charges are generated on the first and second electrodes;
(d) removing the DC poling voltage from the electrically polarizable material;
(e) subsequently removing thermal energy from the electrically polarizable material to cool the electrically polarizable material to a temperature $T_L$ while not allowing current to flow between the first and second electrodes, wherein the DC poling voltage is not applied to the electrically polarizable material while thermal energy is removed from the electrically polarizable material;

(f) subsequently connecting the first and second electrodes across a load; and (g) removing thermal energy from the electrically polarizable material while the first and second electrodes are connected across the load such that electrical energy corresponding to the generated screening charges on the pair of electrodes is output to the load;

wherein the electrically polarizable material exhibits spontaneous polarization at $T_H$ and wherein the spontaneous polarization exhibited by the electrically polarizable material at $T_L$ is lower than the spontaneous polarization exhibited by the electrically polarizable material at $T_H$.

48. The method of claim 47, wherein the electrically polarizable material has a phase transition temperature at which the material transitions between a phase in which the material exhibits spontaneous polarization and a phase in which the material does not exhibit spontaneous polarization.

49. The method of claim 48, wherein the electrically polarizable material is in the phase in which the material exhibits spontaneous polarization at the temperature $T_L$ and $T_H$.

50. The method of claim 48, wherein the electrically polarizable material is in the phase in which the material exhibits spontaneous polarization at the temperature $T_H$ and wherein the electrically polarizable material is in the phase in which the material does not exhibit spontaneous polarization at the temperature $T_L$.

51. The method of claim 48, wherein the electrically polarizable material is a ferroelectric material having a Curie temperature, $T_c$, such that when the temperature of the ferroelectric material is higher than the Curie temperature, $T_c$, the ferroelectric material is in a ferroelectric phase and when the temperature of the ferroelectric material is lower than the Curie temperature, $T_c$, the ferroelectric material is in a paraelectric or anti-ferroelectric phase.

* * * * *